(12) United States Patent
Wells et al.

(10) Patent No.: US 8,557,704 B2
(45) Date of Patent: Oct. 15, 2013

(54) SINGLE SPACER PROCESS FOR MULTIPLYING PITCH BY A FACTOR GREATER THAN TWO AND RELATED INTERMEDIATE IC STRUCTURES

(75) Inventors: David H Wells, Boise, ID (US); Mirzafer K Abatchev, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 12/577,342

(22) Filed: Oct. 12, 2009

(65) Prior Publication Data
US 2010/0029081 A1   Feb. 4, 2010

Related U.S. Application Data

(63) Continuation of application No. 11/514,117, filed on Aug. 30, 2006, now Pat. No. 7,611,980.

(51) Int. Cl.
*H01L 21/302* (2006.01)
*H01L 21/461* (2006.01)

(52) U.S. Cl.
USPC ..... 438/689; 438/942; 438/947; 257/E21.023

(58) Field of Classification Search
USPC .......... 438/424, 702, 942, 946, 947; 257/435, 257/797, 798, E21.023, E21.035, E21.038, 257/E21.24
See application file for complete search history.

(56) References Cited

U.S. PATENT DOCUMENTS

| 4,234,362 | A | 11/1980 | Riseman |
|---|---|---|---|
| 4,419,809 | A | 12/1983 | Riseman et al. |
| 4,432,132 | A | 2/1984 | Kinsbron et al. |
| 4,502,914 | A | 3/1985 | Trumpp et al. |
| 4,508,579 | A | 4/1985 | Goth et al. |
| 4,648,937 | A | 3/1987 | Ogura et al. |
| 4,716,131 | A | 12/1987 | Okazawa et al. |
| 4,776,922 | A | 10/1988 | Bhattacharyya et al. |
| 4,838,991 | A | 6/1989 | Cote et al. |

(Continued)

FOREIGN PATENT DOCUMENTS

| DE | 42 36 609 A1 | 5/1994 |
|---|---|---|
| DE | 4236609 A1 | 5/1994 |

(Continued)

OTHER PUBLICATIONS

Bergeron, et al. "Resolution Enhancement Techniques for the 90nm Technology Node and Beyond," Future Fab International, Issue 15, Jul. 11, 2003, 4 pages.

(Continued)

*Primary Examiner* — Leonard Chang
(74) *Attorney, Agent, or Firm* — Knobbe, Martens, Olson & Bear LLP

(57) ABSTRACT

Single spacer processes for multiplying pitch by a factor greater than two are provided. In one embodiment, n, where n≥2, tiers of stacked mandrels are formed over a substrate, each of the n tiers comprising a plurality of mandrels substantially parallel to one another. Mandrels at tier n are over and parallel to mandrels at tier n−1, and the distance between adjoining mandrels at tier n is greater than the distance between adjoining mandrels at tier n−1. Spacers are simultaneously formed on sidewalls of the mandrels. Exposed portions of the mandrels are etched away and a pattern of lines defined by the spacers is transferred to the substrate.

19 Claims, 36 Drawing Sheets

(56) References Cited

U.S. PATENT DOCUMENTS

| | | |
|---|---|---|
| 5,013,680 A | 5/1991 | Lowrey et al. |
| 5,047,117 A | 9/1991 | Roberts |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A * | 1/1997 | Kim .......................... 430/312 |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Cheng |
| 6,962,867 B2 | 11/2005 | Jackson et al. |
| 7,015,124 B1 | 3/2006 | Fisher et al. |
| 7,026,247 B2 * | 4/2006 | Dokumaci et al. ............ 438/705 |
| 7,074,668 B1 | 7/2006 | Park et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,442,976 B2 | 10/2008 | Juengling |
| 7,537,866 B2 | 5/2009 | King Liu |
| 7,851,135 B2 | 12/2010 | Jung |
| 2001/0004549 A1 * | 6/2001 | Arndt et al. .................. 438/601 |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0210449 A1 | 9/2007 | Caspary et al. |
| 2007/0215874 A1 | 9/2007 | Furukawa et al. |
| 2007/0215960 A1 | 9/2007 | Zhu et al. |

(56) References Cited

U.S. PATENT DOCUMENTS

| | | |
|---|---|---|
| 2007/0275309 A1 | 11/2007 | Liu |
| 2008/0054350 A1 | 3/2008 | Breitwisch et al. |
| 2008/0292991 A1 | 11/2008 | Wallow |

FOREIGN PATENT DOCUMENTS

| | | |
|---|---|---|
| EP | 0 227 303 A2 | 7/1987 |
| EP | 0 491 408 A2 | 6/1992 |
| EP | 1 357 433 A2 | 10/2003 |
| JP | 57-048237 | 3/1982 |
| JP | 64-035916 | 2/1989 |
| JP | 05-343370 | 12/1993 |
| JP | H08-55908 | 2/1996 |
| JP | H08-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 10-1999-0001440 | 1/1999 |
| KR | 10-1999-027887 | 4/1999 |
| TW | 439136 | 6/2001 |
| WO | WO 94/15261 | 7/1994 |
| WO | WO 02/099864 A1 | 12/2002 |
| WO | WO 2004/001799 A2 | 12/2003 |
| WO | WO 2004/003977 | 1/2004 |
| WO | WO 2005/034215 A1 | 4/2005 |
| WO | WO 2006/026699 A2 | 3/2006 |

OTHER PUBLICATIONS

Bhave et al. "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages.

Bruek, "Optical and Interferometric Lithography—Nanotechnology Enablers," 2005, Proceedings of the IEEE, vol. 93, No. 10, pp. 1704-1721.

Choi et al. "Sublithographic nanofabrication technology for nanocatalysts and DNA chips," *J.Vac. Sci. Technol.*, Nov./Dec. 2003; pp. 2951-2955.

Chung et al. "Nanoscale Multi-Line Patterning Using Sidewall Structure," Jpn., J. App.. Phys. vol. 41 (2002) Pt. 1, No. 6B, pp. 4410-4414.

Chung et al. "Pattern multiplication method and the uniformity of nanoscale multiple lines," J.Vac.Sci.Technol. B21(4), Jul./Aug. 2003, pp. 1491-1495.

U.S. Appl. No. 11/543,515, filed Oct. 24, 2006, MICRON Ref. No. 2005-1173.00/US.

Ex parte Cantell, unpublished decision of the Board of Patent Appeals and Interferences, Mar. 4, 2005.

Joubert et al. "Nanometer scale linewidth control during etching of polysilicon gates in high-density plasmas," Microelectronic Engineering 69 (2003), pp. 350-357.

Oehrlein et al. "Pattern transfer into low dielectric materials by high-density plasma etching," Solid State Tech., May 2000, 8 pages.

Office Action of Jun. 2, 2008 in U.S. Appl. No. 11/219,067, filed Sep. 1, 2005.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

PCT Notice of Transmittal of the International Search Report and the Written Opinion of the International Searching Authority, or the Declaration, mailed Jul. 7, 2008, Intl. filed Aug. 20, 2007, Intl. Application No. PCT/US2007/018395.

Sheats et al., "Microlithography: Science and Technology," 1998, Marcel Dekkar, Inc., pp. 104-105.

Search Report dated May 10, 2011 in ROC (Taiwan) Patent Application No. 096131938.

\* cited by examiner

SINGLE SPACER PROCESS FOR MULTIPLYING PITCH BY A FACTOR GREATER THAN TWO AND RELATED INTERMEDIATE IC STRUCTURES

REFERENCE TO RELATED APPLICATIONS

This application is a continuation of U.S. patent application Ser. No. 11/514,117, filed Aug. 30, 2006.

This application is related to and incorporates the following by reference in their entireties: U.S. patent application Ser. No. 11/150,408 of Wells, filed Jun. 9, 2005; U.S. patent application Ser. No. 11/144,543 of Sant et al., filed Jun. 2, 2005; and U.S. patent application Ser. No. 11/217,270 of Wells, filed Sep. 1, 2005; and U.S. patent application Ser. No. 11/134,982 of Abatchev et al., filed May 23, 2005.

BACKGROUND OF THE INVENTION

1. Field of the Invention

This invention, in several embodiments, relates generally to masking techniques for semiconductor fabrication and, more particularly, to masking techniques including pitch multiplication.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident in the integrated circuit (IC) industry, for example, in memory circuits or devices such as dynamic random access memories (DRAMs), flash memories, static random access memories (SRAMs) and ferroelectric (FE) memories. Other examples of integrated circuit memories include MRAM (including magneto resistive elements), programmable fuse memories, programmable conductor memories (including metal-doped chalcogenide glass elements), SRAM, SDRAM, EEPROM and other volatile and non-volatile memory schemes. To take one example, a DRAM conventionally comprises millions of identical circuit elements, known as memory cells. DRAM memory cells conventionally include two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that comprise memory cells and the sizes of the conducting lines that access the memory cells, memory devices can be made smaller. Additionally, storage capacities can be increased by fitting more memory cells within a given area in memory devices.

Features, such as conductive lines, are conventionally formed using a process in which a pattern defining the features is first formed in a temporary layer over a semiconductor substrate and subsequently transferred to the substrate using conventional etching chemistries. Photolithography is commonly used to pattern such features within a photodefinable (or photoresist) layer. In photolithography, a pattern of features is formed in the photodefinable layer using a process which includes directing light (or radiation) through a reticle having a pattern corresponding to the pattern of features to be formed in the substrate.

The sizes of features can be described by the concept of "pitch," which is defined as the distance between identical points in two neighboring features. These features are typically defined by spaces between adjacent features. Spaces are typically filled by a material, such as an insulator. As a result, for regular patterns (e.g., in arrays), pitch can be viewed as the sum of the width of a feature and the width of the space on one side of the feature separating that feature from a neighboring feature. However, due to factors such as optics and light (or radiation) wavelength, photolithography techniques each have a minimum pitch below which a particular photolithographic technique cannot reliably form features. Consequently, the minimum pitch restriction of a given photolithographic technique is an impediment to further reduction in feature sizes.

"Pitch multiplication" or "pitch doubling" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (such as an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. Pitch can thus be used in two converse senses: the distance between identical elements in a regular pattern and the number of features in a fixed linear distance. Pitch multiplication (or pitch doubling) assumes the latter sense, i.e., if the pitch is doubled, two features and spaces are defined in a region where photolithography had defined only one feature and space.

U.S. patent application Ser. No. 11/150,408, to Wells ("Wells"), filed Jun. 9, 2005, discloses methods for forming pitch-multiplied features using spacers as mandrels for subsequent spacers. According to methods disclosed therein, a first set of spacers is formed on sidewalls of mandrels over a substrate. The width of the spacers is selected based upon the sidewall positions so that the spacers are centered at desired positions. The mandrels are removed and the spacers are used as mandrels for a subsequent spacer formation. A second material is then deposited on the first set of spacers and etched back to form a second set of spacers. The widths of the second set of spacers are chosen so that these spacers are also centered at their desired positions. The first set of spacers is removed and the second set of spacers is used as a mask for etching a substrate. Accordingly, pitch multiplication by a factor of four is achieved, and this technique can therefore be extended to pitch multiplication by a factor of 8, 16, etc.

As another example, U.S. patent application Ser. No. 11/144,543 to Sant et al. ("Sant"), filed Jun. 2, 2005, discloses methods for forming pitch-multiplied features using multiple stages of spacer formation. According to methods disclosed therein, multiple pitch-multiplied spacers are used to form mask patterns having features with exceptionally small critical dimensions. One of each pair of spacers formed around a plurality of mandrels is removed and alternating layers, formed of two mutually selectively etchable materials, are deposited around the remaining spacers. Layers formed of one of the materials are then etched, leaving behind vertically-extending layers formed of the other of the materials, which form a mask pattern. As an alternative, instead of depositing alternating layers, amorphous carbon is deposited around the remaining spacers followed by a plurality of cycles of forming pairs of spacers on the amorphous carbon, removing one of the pairs of spacers and depositing an amorphous carbon layer. The cycles can be repeated to form the desired pattern.

Methods using multiple spacer formation steps for pitch multiplication lead to large processing costs. For example, the process of U.S. patent application Ser. No. 11/150,408 of Wells forms spacers twice to achieve pitch multiplication by a factor of four. Additionally, forming closely-spaced features entails use of high-resolution optical scanners, which can increase processing costs. For example, a 248 nanometer (nm) optical scanner with a resolution of about 100 nm costs about $20 million at the time of filing, and a 193 nm scanner with a resolution of about 65 nm costs about $30 million. Additionally, photoresist materials currently available for use with 193 nm scanners are less robust than those available for 248 nm scanners, adding to the limitations of spacer formation on state-of-the-art photoresist masks.

Accordingly, it would be advantageous to form features below the minimum pitch of a photolithographic technique, while minimizing the number of processing steps and, ultimately, processing times and costs. Additionally, it would be advantageous to permit flexibility in the degree to which pitch is multiplied.

BRIEF DESCRIPTION OF THE DRAWINGS

The invention will be better understood from the Detailed Description of the Embodiments and from the appended drawings, which merely illustrate and do not limit the invention, and wherein:

FIGS. 3-12 schematically illustrate a method similar to that of FIGS. 2A-2F for forming a pattern of lines pitch-multiplied by a factor of four, in accordance with an embodiment of the invention;

FIG. 3 is a schematic, cross-sectional side view of a partially-formed integrated circuit, showing, from top to bottom, a photodefinable layer, a temporary layer, a hard mask layer, a transfer layer and a substrate, in accordance with an embodiment of the invention;

FIG. 5 is a schematic, cross-sectional side view of the partially-formed integrated circuit of FIGS. 4A and 4B, after the pattern of lines is transferred to the temporary layer, in accordance with an embodiment of the invention;

FIG. 7 is a schematic, cross-sectional side view of the partially-formed integrated circuit of FIGS. 6A and 6B, after a spacer material is conformally blanket deposited over the substrate, in accordance with an embodiment of the invention;

FIG. 8 is a schematic, cross-sectional side view of the partially-formed integrated circuit of FIG. 7, after the spacer material is etched to form spacers on sidewalls of the mandrels, in accordance with an embodiment of the invention;

FIG. 9 is a schematic, cross-sectional side view of the partially-formed integrated circuit of FIG. 8, after the second mandrels are etched away, in accordance with an embodiment of the invention;

FIG. 10 is a schematic, cross-sectional side view of the partially-formed integrated circuit of FIG. 9, after exposed portions of the first mandrels are etched away, leaving a pattern of lines over the hard mask layer, in accordance with an embodiment of the invention;

FIG. 11 is a schematic, cross-sectional side view of the partially-formed integrated circuit of FIG. 10, after the pattern of lines is transferred to the hard mask layer and the transfer layer, in accordance with an embodiment of the invention;

FIGS. 14-22B schematically illustrate a method similar to that of FIGS. 13A-13H for forming a pattern of lines pitch-multiplied by a factor of six, in accordance with an embodiment of the invention;

FIG. 14 is a schematic, cross-sectional side view of a partially-formed integrated circuit, showing, from bottom to top, a substrate, a transfer layer, a first hard mask layer, a second hard mask layer, a third hard mask layer and a photodefinable layer, in accordance with an embodiment of the invention;

FIG. 16 is a schematic, cross-sectional side view of the partially-formed integrated circuit of FIGS. 15A and 15B, after the pattern of lines is transferred to the second and third hard mask layers, in accordance with an embodiment of the invention;

FIG. 17 is a schematic, cross-sectional side view of the partially-formed integrated circuit of FIG. 16, after stacked mandrels are differentially trimmed by isotropic and selective etching. Lines comprising the second hard mask layer, third hard mask layer and photodefinable layer define first, second and third mandrels, in accordance with an embodiment of the invention;

FIG. 18 is a schematic, cross-sectional side view of the partially-formed integrated circuit of FIG. 17, after a spacer material is conformally blanket deposited over the substrate, in accordance with an embodiment of the invention;

FIG. 19 is a schematic, cross-sectional side view of the partially-formed integrated circuit of FIG. 18, after the spacer material is etched to form spacers on sidewalls of the mandrels, in accordance with an embodiment of the invention;

FIG. 20 is a schematic, cross-sectional side view of the partially-formed integrated circuit of FIG. 19, after exposed portions of the first, second and third mandrels are etched away, leaving a pattern of lines over the first hard mask layer, in accordance with an embodiment of the invention;

FIG. 21 is a schematic, cross-sectional side view of the partially-formed integrated circuit of FIG. 20, after the pattern of lines is transferred to the first hard mask layer and the transfer layer, in accordance with an embodiment of the invention;

FIGS. 22A and 22B are schematic, cross-sectional side and top plan views of the partially-formed integrated circuit of FIG. 21, after the pattern of lines is transferred to the substrate, the hard mask and transfer layers are removed, and terminal ends of the lines are etched away to leave isolated lines, in accordance with an embodiment of the invention.

Figure 1A:
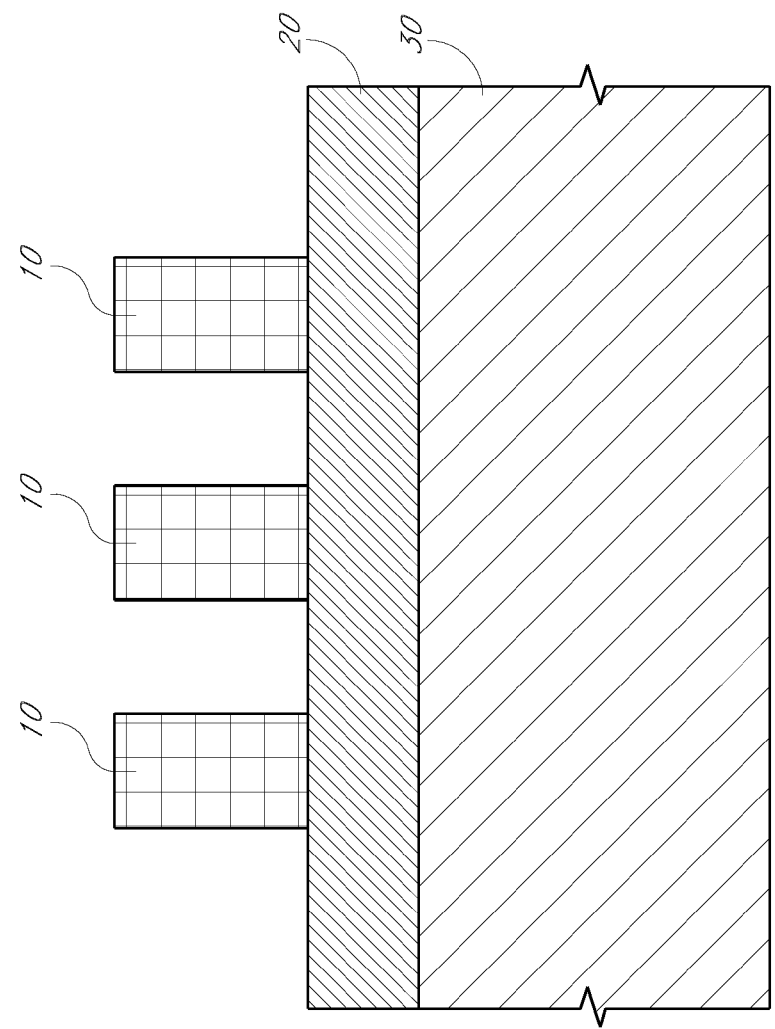
FIGS. 1A-1F are schematic, cross-sectional side views of a sequence of masking patterns for forming conductive lines, in accordance with a prior art pitch doubling method.
Figure 1B:
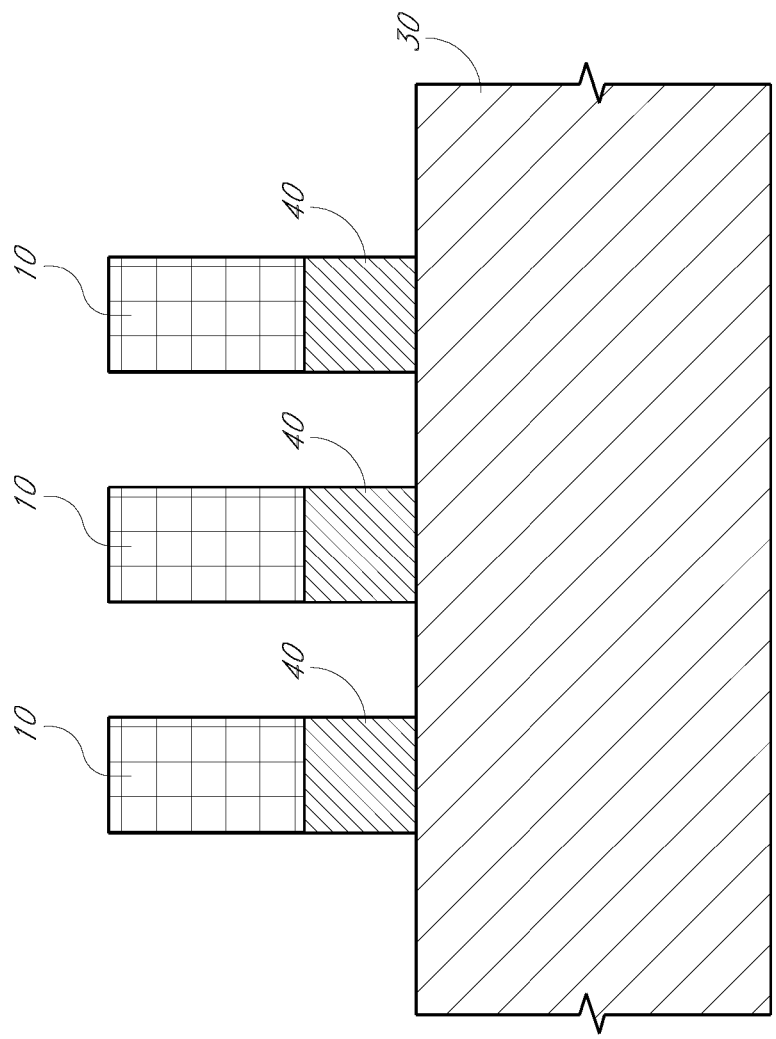
Figure 1C:
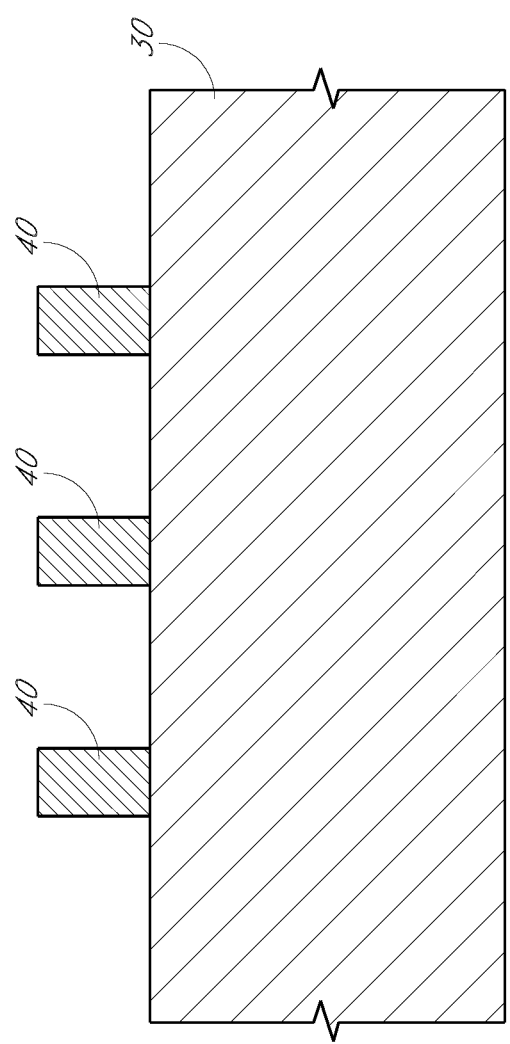
Figure 1D:
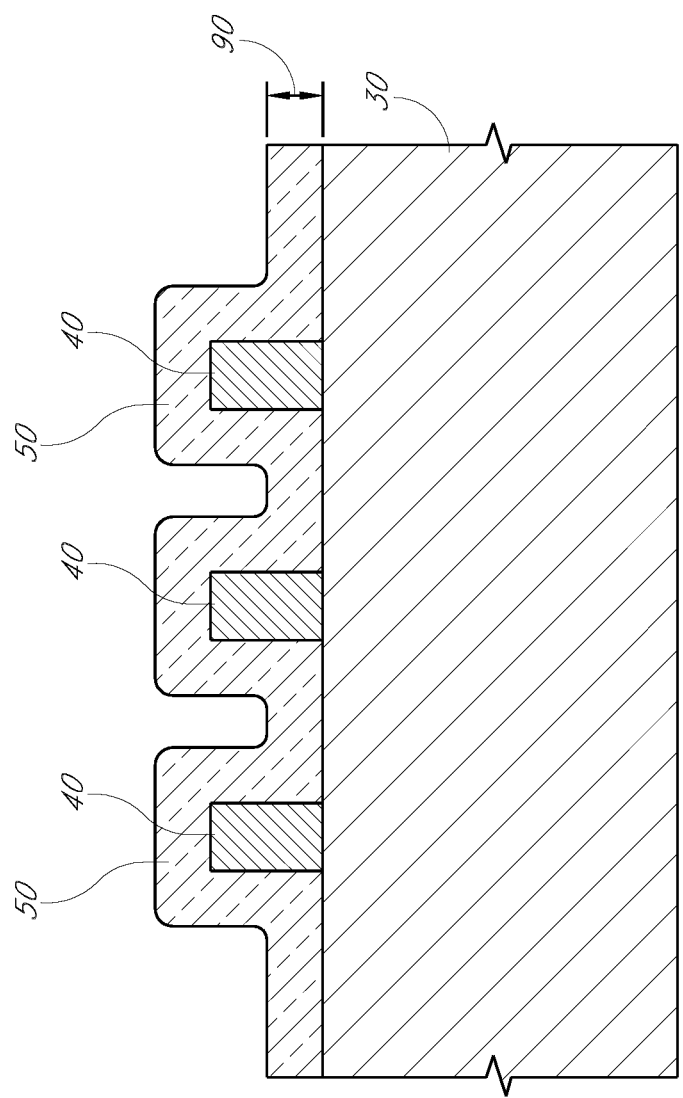
Figure 1E:
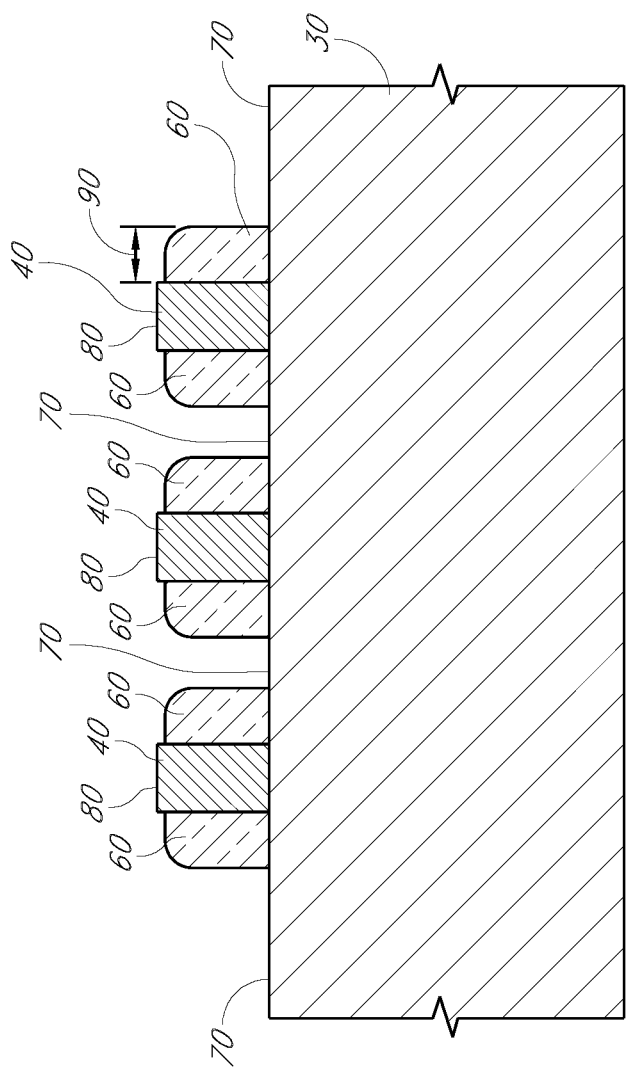
Figure 1F:
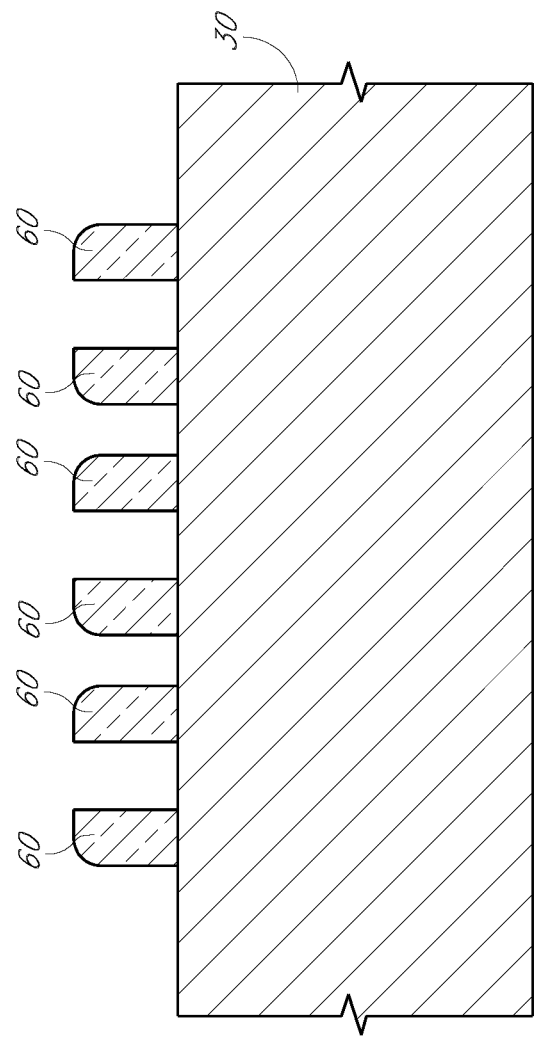

It will be appreciated that the drawings and features therein are not drawn to scale.

DETAILED DESCRIPTION OF EMBODIMENTS

In accordance with embodiments of the invention, methods are provided in which pitch multiplication by a factor of 2n is accomplished using a single spacer step, thus providing substantial flexibility and savings in processing times and costs. Additionally, methods according to embodiments can be performed using less expensive optical scanners (e.g., 365 nm scanners), thus adding additional savings in processing costs.

In accordance with embodiments of the invention, n, where n≥2, tiers of stacked mandrels are provided over a substrate. The substrate may comprise a silicon wafer, a wafer of another semiconductive material, or another bulk substrate including a layer of a semiconductive material, and one or more intervening layers, such as, e.g., hard mask layers. Each of the n tiers of mandrels can comprise a plurality of mandrels that are substantially parallel to one another. In one embodiment, the mandrels define parallel lines. Mandrels at tier n may be disposed over mandrels at tier n−1, disposed on and centered with respect to mandrels at tier n−1 and in direct contact with mandrels at tier n−1. The lateral distance or spacing between adjacent mandrels at tier n may be greater than the lateral distance or spacing between adjacent mandrels at tier n−1. Next, spacers are simultaneously formed around the mandrels, and exposed portions of the mandrels are removed, leaving a pattern of spacers. The spacer pattern is then used for processing. For example, an etching chemistry can be subsequently provided to transfer the spacer pattern to the underlying substrate. This step may entail transferring the spacer pattern to one or more hard mask layers overlying the substrate and subsequently removing the spacers. The pitch according to methods of embodiments of the invention may be multiplied by a factor of 2n. For example, with two tiers of mandrels (n=2), the pitch is multiplied by a factor of four, and with three tiers of mandrels (n=3), the pitch is multiplied by a factor of six, eight, etc.

In one embodiment, the substrate comprises an upper inter-level dielectric (ILD) layer and processing through the mask forms damascene trenches. In such a case, the spacer pattern comprises elongated lines with connecting loop ends, and the method further comprises blocking the loop ends prior to transferring the spacer pattern into the ILD. In another embodiment, the substrate comprises a conductor (e.g., Si, polysilicon, Al, W, $WSi_x$, Ti, TiN, etc.) and the spacer pattern comprises elongated lines with connecting loop ends. In such a case, the loop ends are removed either before or after transferring the spacer pattern transfer to the conductor.

Methods of embodiments may be used to form a pattern of features (e.g., lines) pitch-multiplied by a factor of four, six, etc. Such features can serve as components in various devices, such as devices having regular arrays of electrical devices, and particularly arrays of lines for memory cell arrays for volatile and non-volatile memory devices such as DRAM, ROM or flash memory, including NAND flash memory, and logic arrays.

It will be appreciated that a material is considered selectively, or preferentially, etchable when the etch rate for that material is at least about 2 times greater than that for other materials exposed to the same etchant. In some embodiments, the etch rate is at least about 10 times greater, at least about 20 times greater or at least about 40 times greater than that for other materials exposed to the same etchant. In the context of embodiments of the invention, "selectivity" is used to denote an etch rate of one or more materials relative to that of one or more other materials for a given etchant. As an example, for a substrate comprising a first layer and a second layer, an etching chemistry that is selective to the material comprising the first layer etches the first layer at a substantially greater rate than the second layer.

Embodiments of the invention will be discussed in the context of two cases. In a first case, a pattern of features pitch-multiplied by a factor of four is formed in a substrate. In a second case, a pattern of features pitch-multiplied by a factor of six is formed in a substrate. It will be appreciated that the methods provided herein can be used to form features pitch-multiplied by a factor greater than six. As an example, methods according to embodiments can be used to form features pitch-multiplied by a factor of eight, ten, etc.

Reference will now be made to the figures, wherein like numerals refer to like parts throughout. It will be appreciated that the figures and features therein are not necessarily drawn to scale. Furthermore, while the description below specifies particular materials, the skilled artisan will readily appreciate that other combinations of materials can be employed with fewer or greater numbers of hard mask and temporary layers, with or without additional etch stop layers therebetween, provided that suitable selective etching chemistries are available for the transfer steps described.

Pitch Multiplication by a Factor of Four

Figure 2A:
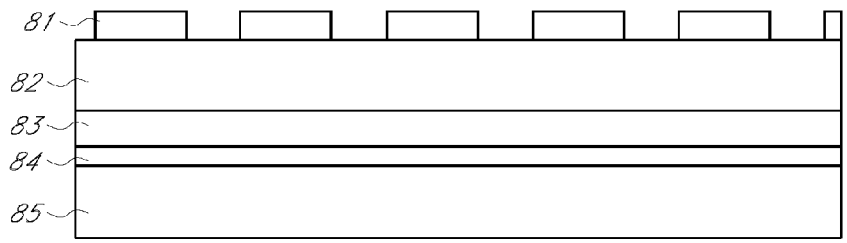
FIGS. 2A-2F are schematic, cross-sectional side views of a process for forming a pattern of features pitch-multiplied by a factor of four, in accordance with an embodiment of the invention.

With reference to FIG. 2A, in an embodiment, a pattern of features is formed in a photodefinable layer 81 disposed over a plurality of layers, which include, from top to bottom, a first hard mask layer 82, a second hard mask layer 83, a third hard mask layer 84 and a substrate 85. The substrate may include a top semiconductor layer or a portion of a wafer to be patterned or doped, a conductive layer to be patterned or an insulator to be patterned to form, e.g., damascene features. While the illustrated embodiment comprises first, second and third hard mask layers 82-84, it will be appreciated that other layers may be provided as required. The third hard mask layer 84 can also be referred to as an "etch stop" or "transfer layer". Additionally, while numbered first, second and third (from top to bottom), the terminology can readily be used in the reverse sequence.

It will be appreciated that method embodiments may be used to pattern a conductive layer (e.g., Si, polysilicon, Al, W, $WSi_x$, Ti, TiN, etc.) over a semiconductor wafer to form conductive lines, a semiconductor wafer, or an insulator (e.g., $SiO_2$) over a semiconductor wafer to form damascene features.

Figure 2B:
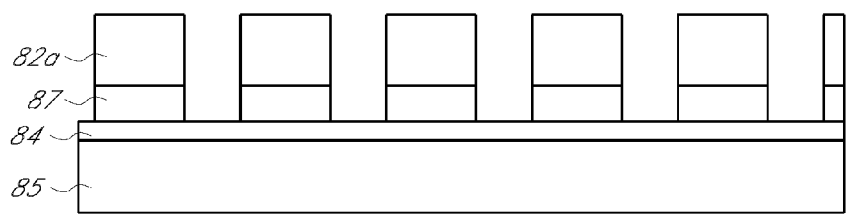
Figure 2C:
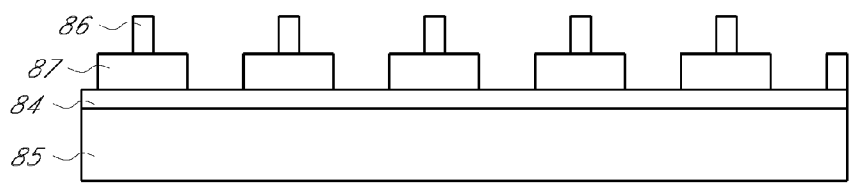

With reference to FIG. 2B, the pattern of features is transferred to the first and second hard mask layers 82 and 83 using an etching chemistry selective to the material comprising the first and second hard mask layers 82 and 83. That is, the etching chemistry etches the first and second hard mask layers 82 and 83 at a faster rate than the surrounding layers, such as the exposed third hard mask layer 84. The pattern transfer can simultaneously remove the photodefinable layer 81, or it can be removed in a separate step. Next, the first hard mask layer 82 is isotropically etched (or "trimmed"), as shown in FIG. 2C. Features comprising the first and second hard mask layers 82 and 83 define a plurality of first mandrels 86 and a plurality of second mandrels 87, respectively. The first mandrels extend parallel to the second mandrels. While not shown, in other arrangements the second mandrels 87 can also be trimmed if desired to increase the spacing therebetween, but they remain wider than the overlying first mandrels 86.

In the illustrated embodiment, the first and second mandrels 86 and 87 are parallel lines oriented into the plane of the page. Each first mandrel 86 may have a first width smaller than a second width of the corresponding underlying second mandrel 87. The first mandrel 86 may be substantially disposed on the second mandrel 87. In an embodiment, the first mandrel 86 is centered with respect to the second mandrel 87.

Figure 2D:
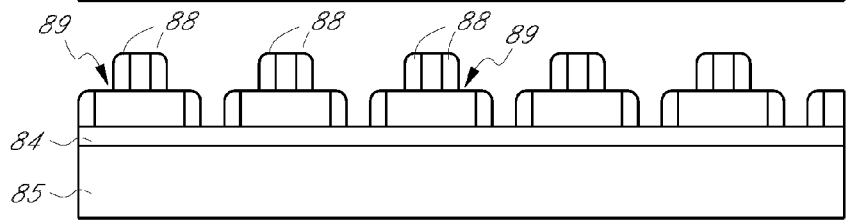

Next, with reference to FIG. 2D, spacers 88 are simultaneously formed on sidewalls of the first and second mandrels 86 and 87. As is known in the art, such spacers may be formed by conformal deposition and an anisotropic (or directional) selective removal of horizontal portions of a spacer layer.

Figure 2E:
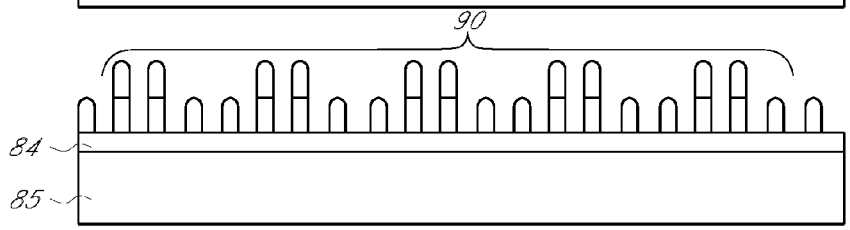
Figure 2F:
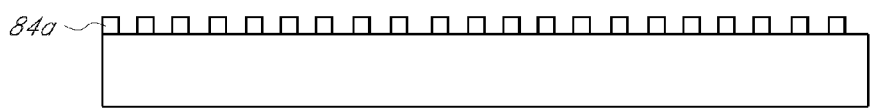

With reference to FIG. 2E, exposed portions 89 of the first and second mandrels 86 and 87 are etched to form a spacer pattern 90. The spacer pattern 90 can then be used as a hard mask. For example, the pattern 90 can be subsequently transferred to the third hard mask layer 84, as shown in FIG. 2F, forming a pattern of lines 84a in the third hard mask layer 84. Consequently, a pattern of features pitch-multiplied by a factor of four (relative to the pattern of features formed in the photodefinable layer) is formed over the substrate. The third hard mask layer 84 will serve as a mask to transfer the pattern of lines 84a to the substrate 85. It will be understood that this lowest level of hard mask is optional, but is advantageous in creating low profile, short mask features to minimize effects of aspect ratio dependent etching (ARDE) and/or microloading effects that would result from direct use of the structure of FIG. 2E as a mask to process the substrate 85.

Figure 3:
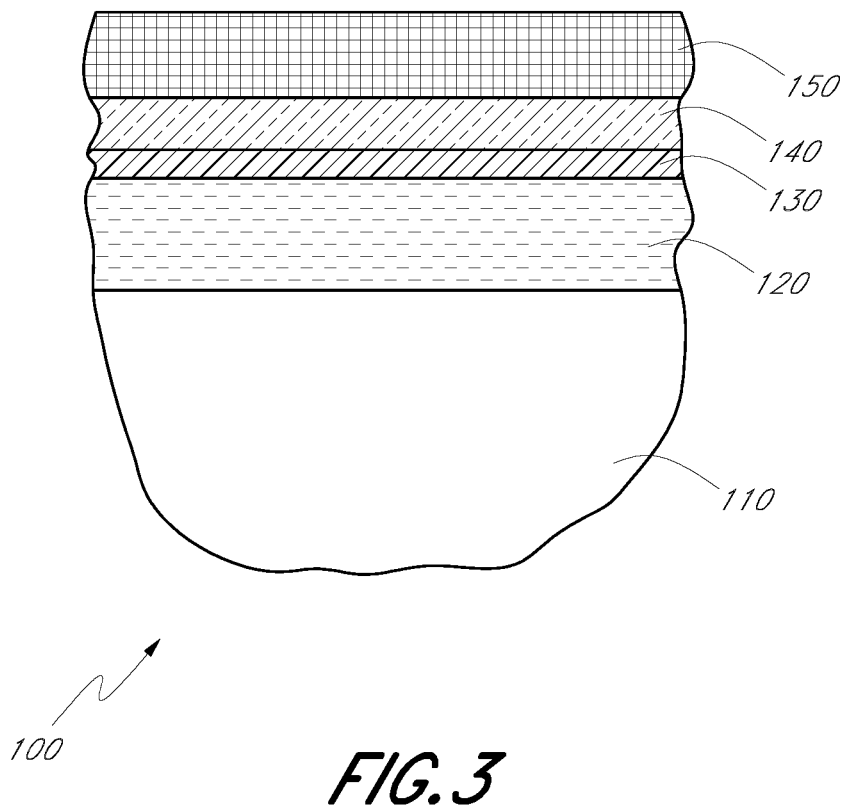

With reference to FIGS. 3-12, in an embodiment of the invention, a process for forming features pitch-multiplied by a factor of four is illustrated. The process is similar to that of FIGS. 2A-2F, except that an initial photodefinable layer is employed as one of the mandrel layers. FIG. 3 shows a cross-sectional side view of a partially-formed integrated circuit 100.

With continued reference to FIG. 3, various masking layers 120-150 are provided above a substrate 110. The layers 120-150 will be used to form a mask for patterning the substrate 110, as discussed below. The materials for the layers 120-150 overlying the substrate 110 may be chosen based upon consideration of the chemistry and process conditions for the various pattern-forming and pattern-transferring steps discussed herein. Because the layers between a topmost selectively definable layer 150 and the substrate 110 may function to transfer a pattern to the substrate 110, each of the layers 120-140 between the selectively definable (e.g., photodefinable) layer 150 and the substrate 110 may be chosen so that they can be selectively etched relative to other exposed materials. Because a goal of the layers 120-150 overlying the substrate 110 is to allow well-defined patterns to be formed in the substrate 110, it will be appreciated that one or more of the layers 120-150 can be substituted if suitable materials, selective etch chemistries and/or process conditions are used. Additionally, it will be appreciated that additional masking layers can be added over the substrate 110 to form a mask having improved etch selectivity relative to the substrate 110. For example, if the layer 150 is a hard mask layer, an additional photodefinable layer (not shown) may be provided over layer 150. Exemplary materials for the various layers discussed herein include silicon oxide (e.g., $SiO_2$), metal oxide (e.g., $Al_2O_3$), silicon nitride ($Si_3N_4$), polysilicon (polySi), amorphous silicon (a-Si), amorphous carbon (a-C), and dielectric antireflective coating (DARC, silicon rich silicon oxynitride), each of which can be reliably and selectively etched relative to at least three of the other materials.

With continued reference to FIG. 3, the integrated circuit 100 comprises, from bottom to top, the substrate 110, a transfer layer 120, a hard mask layer 130, another hard mask layer (also "temporary layer" herein) 140 and a photodefinable (or photoresist) layer 150. The substrate 110 may be a silicon wafer, a wafer of another semiconductive material, or another bulk substrate including a layer of a semiconductive material. In some embodiments, the substrate 110 may comprise additional layers and features (not shown). The photoresist layer 150 may be formed of any photoresist material, including any photoresist material known in the art. The photoresist layer 150 may be compatible with, e.g., 157 nm, 193 nm, 248 nm or 365 nm wavelength optical scanners, 193 nm wavelength immersion systems, extreme ultraviolet systems (including 13.7 nm systems), or electron beam lithographic systems. Examples of suitable photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. In other embodiments, the layer 150 and any subsequent resist layers may be formed of a resist that can be patterned by nano-imprint lithography, e.g., by using a mold or mechanical force to pattern the resist. As one example, the photoresist 150 can comprise, e.g., a chemically amplified resist material, such FEP-171 from FUJIFILM OLIN Co., Ltd. or EP-009 from Tokyo Ohka Kogyo Co., Ltd.

In accordance with embodiments of the invention, optical scanners employing longer wavelengths are used to enable reduction in processing costs. Methods according to embodiments of the invention enable use of photolithography systems with resolution limits greater than 150 nm or greater than 200 nm to get feature sizes one half, one quarter, one sixth, etc. the resolution limit. For example, 248 nm optical scanners can be used to achieve the same feature spacing (e.g., line or trench spacing) obtainable using 157 nm scanners or even smaller.

With continued reference to FIG. 3, the material for each of the layers 120-150 is chosen based on the material selected for the other layers and the substrate 110, all of which are chosen so that selective etch chemistries available for the etch steps described below. As an example, with the layer 150 being a photoresist layer, the temporary layer 140 may be formed of silicon (e.g., amorphous silicon), the hard mask layer 130 may be formed of silicon nitride ($Si_3N_4$), and the transfer layer 120 may be formed of amorphous carbon or a polysilicon/silicon dioxide bilayer. Table 1 lists suitable combinations of materials for each of the layers 120-150. It will be appreciated that other materials for each of the layers 120-150 are possible.

TABLE 1

| Layer | Combination 1 | Combination 2 | Combination 3 | Combination 4 | Combination 5 |
|---|---|---|---|---|---|
| 150 | Resist | a-C | a-C | Si | $SiO_2$ |
| 140 | a-Si | a-Si | a-Si | $Si_3N_4$ or $SiO_2$ | Si or $Si_3N_4$ |
| 130 | $Si_3N_4$, $Al_2O_3$ or $HfO_2$ | $Si_3N_4$ | $Al_2O_3$ or $HfO_2$ | $Al_2O_3$ or $HfO_2$ | $Si_3N_4$, Si, $Al_2O_3$ or $HfO_2$ |
| 120 | a-C or polySi/$SiO_2$ bilayer | a-C or polySi/$SiO_2$ bilayer | a-C or polySi/$SiO_2$ bilayer | a-C or polySi/$SiO_2$ bilayer | a-C or polySi/$SiO_2$ bilayer |

If layer 150 is not a photoresist layer (Combinations 2-5), a photoresist layer may be provided over the topmost of the hard mask layers 120-150. For example, if layer 150 is formed of a-C, a photodefinable layer (in addition to other layers, if required) may be provided over the a-C layer. While examples of certain combinations of materials and layers are provided in Table 1, it will be appreciated that other combinations of materials and layers are within the scope of embodiments of the invention.

The transfer layer 120, hard mask layer 130 and temporary layer 140 may be applied using any deposition technique known in the art, including, without limitation, spin-on deposition, chemical vapor deposition (CVD), digital CVD, atomic layer deposition (ALD), plasma-enhanced ALD (PEALD) and physical vapor deposition (PVD). The photodefinable layer 150 is typically applied by spin coating.

Having formed a desired stack of layers 120-150, a pattern of spacers is next formed by pitch multiplication. In the embodiment described below, layers 120-150 are selected according to Combination 1 of Table 1. While the etching chemistries provided below are suitable for this combination, it will be appreciated that they may be applied to other combinations.

Figure 4A:
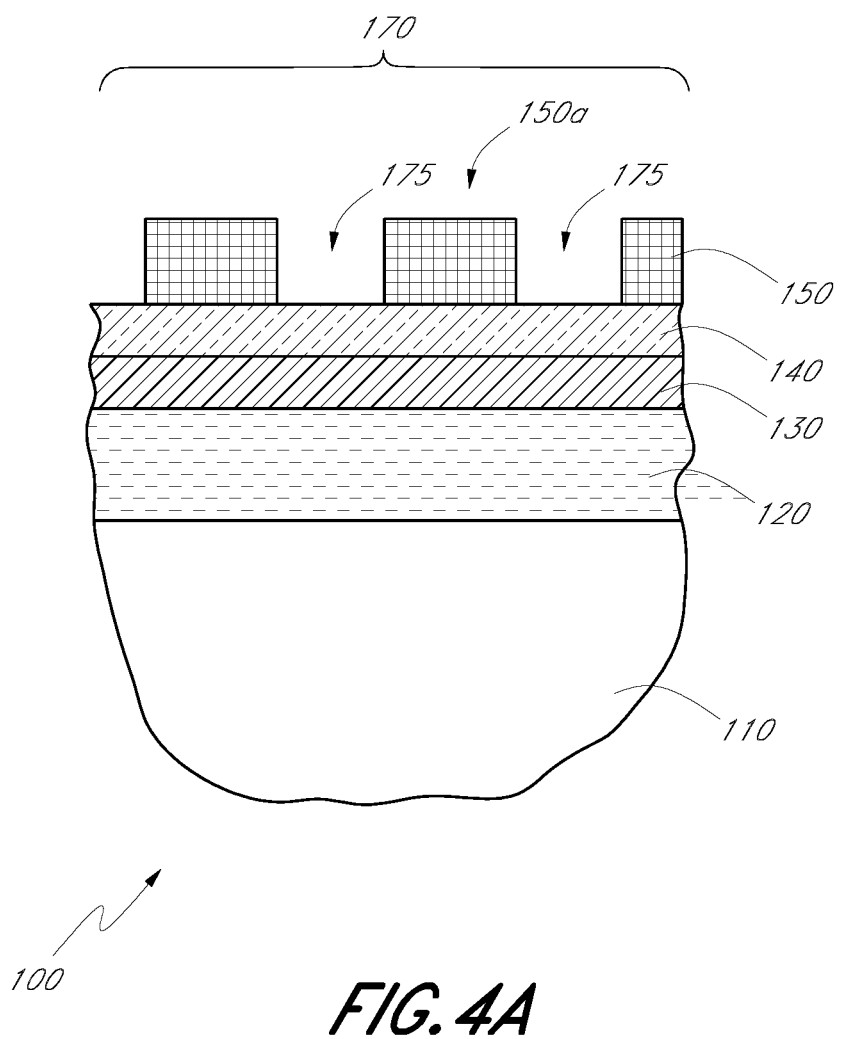
FIGS. 4A and 4B are schematic, cross-sectional side and top plan views of the partially-formed integrated circuit of FIG. 3, after a pattern of lines is formed in the photodefinable layer, in accordance with an embodiment of the invention.
Figure 4B:
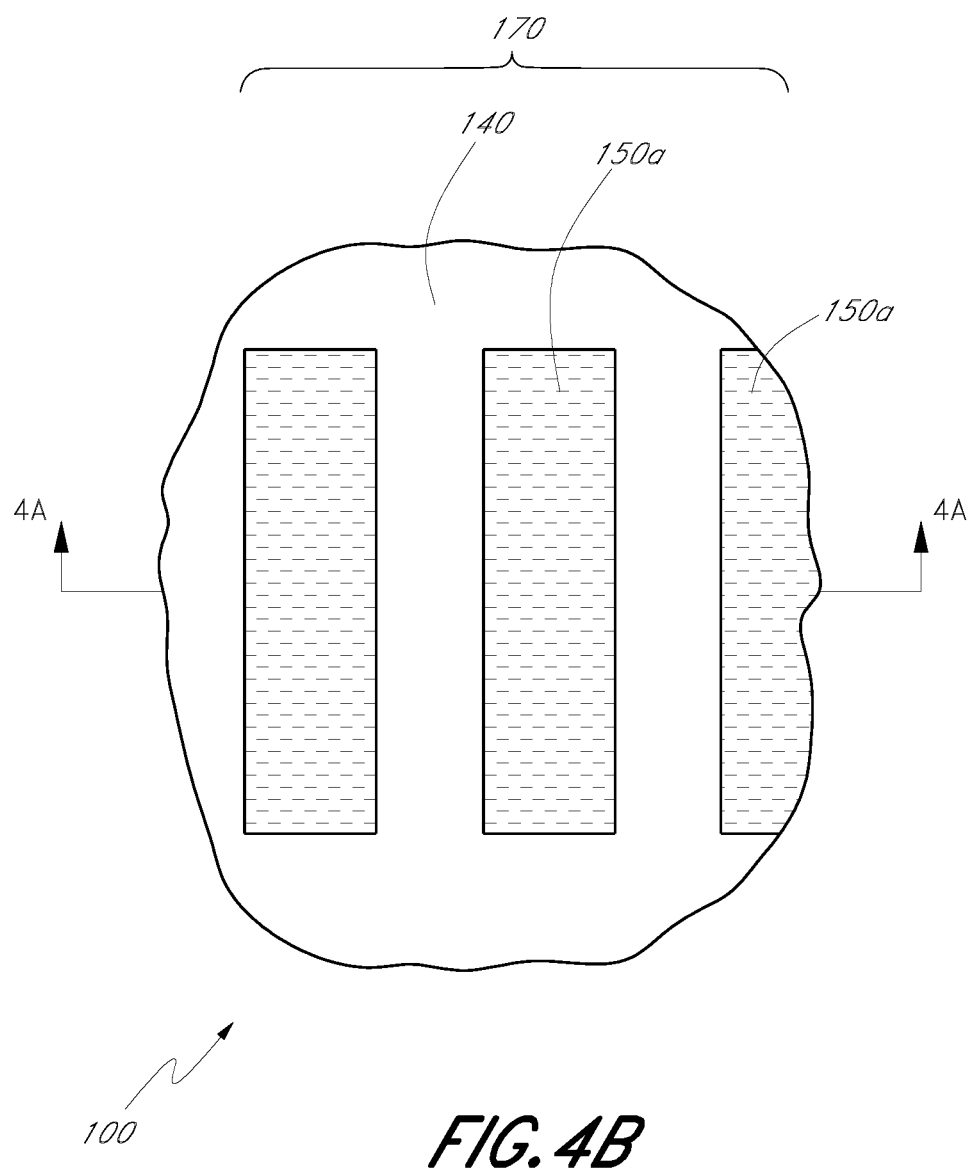

With reference to FIGS. 4A and 4B, a pattern 170 comprising spaces or trenches 175, which are delimited by features 150a formed of photodefinable material, is formed in the photodefinable layer 150. FIG. 4B is a schematic, top-plan view of the in-process (or partially formed) integrated circuit 100 following formation of the pattern 170 in the photodefinable layer 150. FIG. 4A is a cross-section taken along line 4A-4A of FIG. 4B. The trenches 175 may be formed by, e.g., photolithography using 248 nm or 193 nm light, in which the photodefinable layer 150 is exposed to radiation through a reticle and then developed. After being developed, the remaining photoresist material forms mask features, such as lines 150a.

The features 150a may comprise parallel and elongated lines, as shown, with their parallel lengths at least 10 times their widths, more typically at least 100 times their widths. While parallel for the majority of their lengths, it will be understood from the description of FIGS. 25A-25C (described below) that the lines can include bends or turns particularly to facilitate contacts. The features are most useful for forming regular arrays of lines, e.g., for use as conductive lines in logic on memory arrays.

Figure 5:
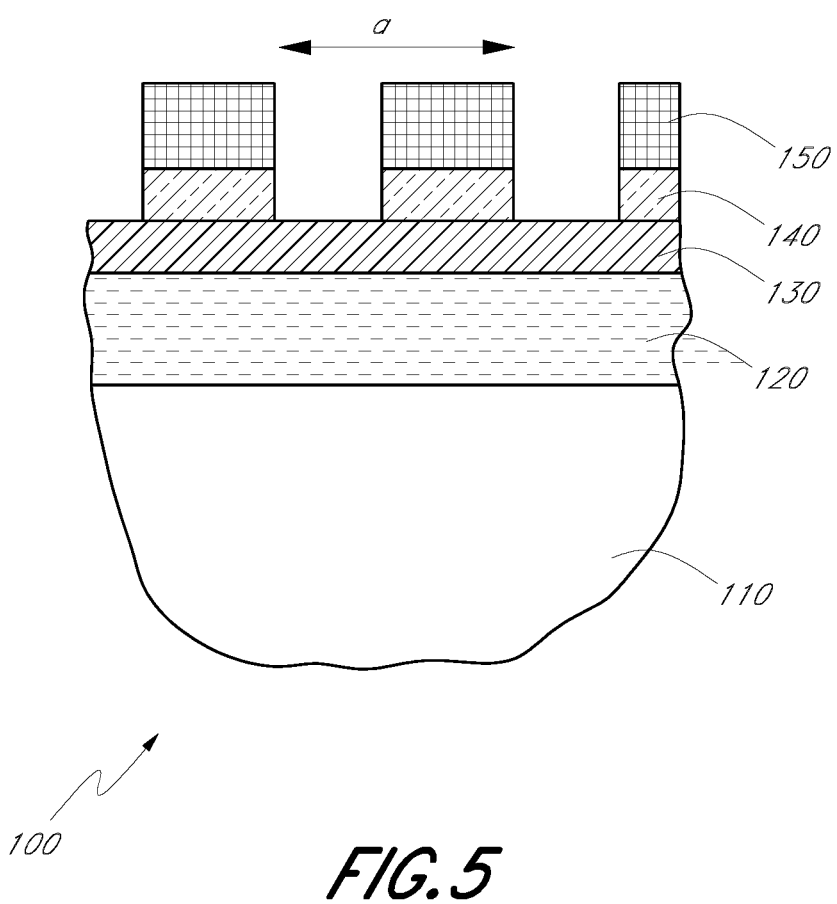

With reference to FIG. 5, the pattern 170 in the photodefinable layer 150 is transferred to the temporary layer 140, creating corresponding lines 140a. In the illustrated embodiment, "a" designates the pitch. This transfer may be accomplished using an anisotropic (or directional) etch selective to the material of the layers 140 and 150. In one embodiment, the pattern transfer comprises using an etching chemistry selective for the material of layer 140 relative to layers 130 and 150. The pattern transfer may be accomplished using, e.g., a hydrogen bromide (HBr) plasma. In the illustrated embodiment, the etching chemistry does not significantly remove the material comprising layer 130, which in the illustrated embodiment acts as an etch stop.

Figure 6A:
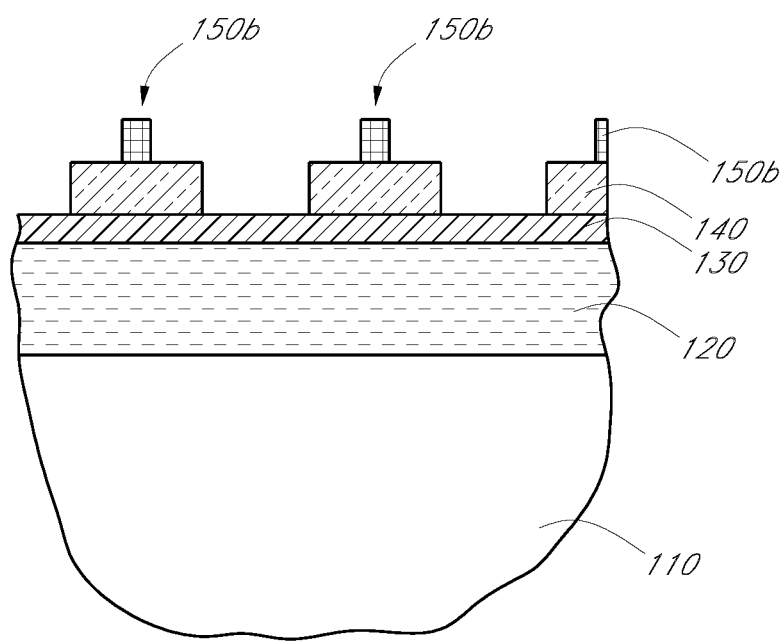
FIGS. 6A and 6B are schematic, cross-sectional side and top plan views of the partially-formed integrated circuit of FIG. 5, after the photodefinable layer is isotropically etched (or trimmed). Lines comprising the temporary layer and photodefinable layer define first and second mandrels, in accordance with an embodiment of the invention.
Figure 6B:
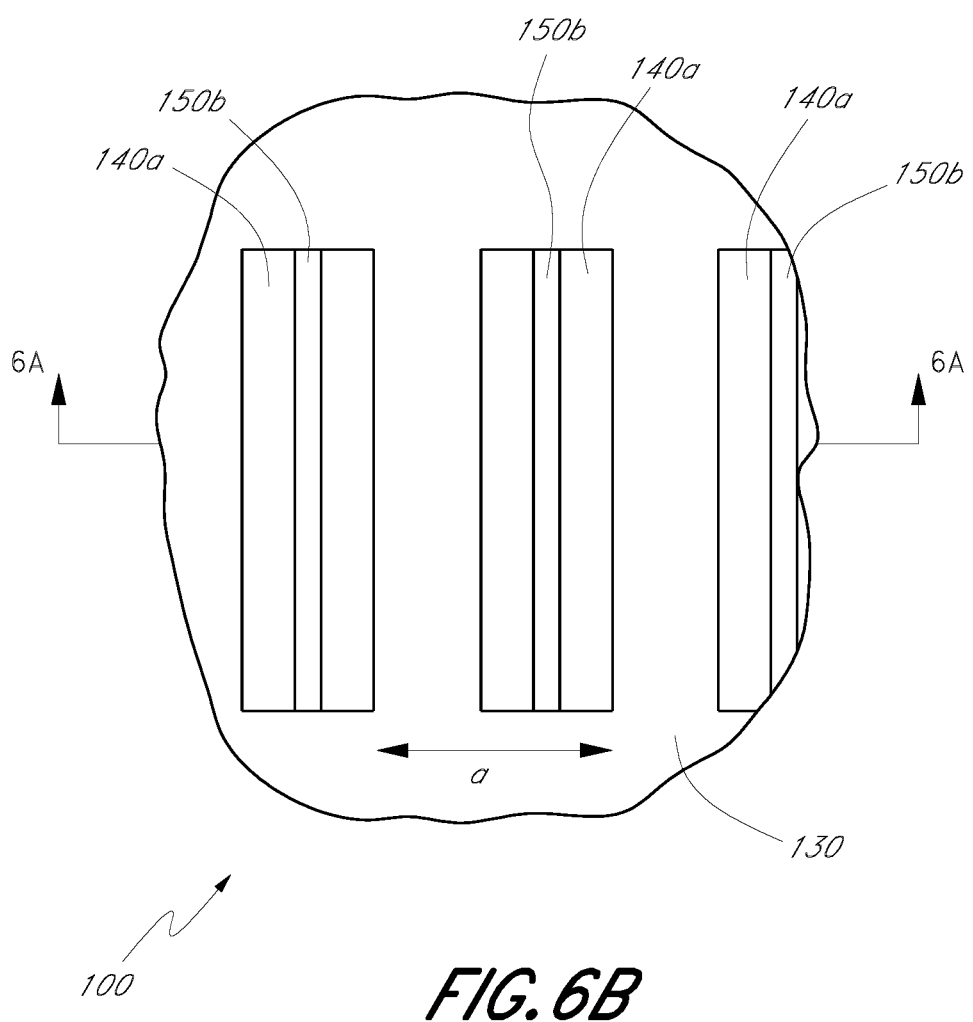

With reference to FIGS. 6A and 6B, the lines 150a are "trimmed" by isotropically and selectively etching relative to the lines 140a and the hard mask layer 130 to form lines 150b. FIG. 6B is a schematic, top-plan view of the integrated circuit 100 following etching of lines 150a. FIG. 6A is a cross-section taken along line 6A-6A of FIG. 6B. In one embodiment, the isotropic etch does not etch layer 130 and lines 140a. Alternatively, the underlying lines 140a can also be trimmed to a lesser extent, either by the same etch or a separate etch. The etching chemistry is selected based on the material of layer 130 and lines 140a and 150a. Lines 150a of the illustrated photoresist may be isotropically etched using, e.g., an $O_2/Cl_2$, $O_2$/HBr plasma or an $O_2/SO_2/N_2$ plasma.

With continued reference to FIGS. 6A and 6B, lines 140a and 150b define first and second mandrels, respectively. The mandrels 140a and 150b will serve as placeholders for spacers (see below).

Figure 7:
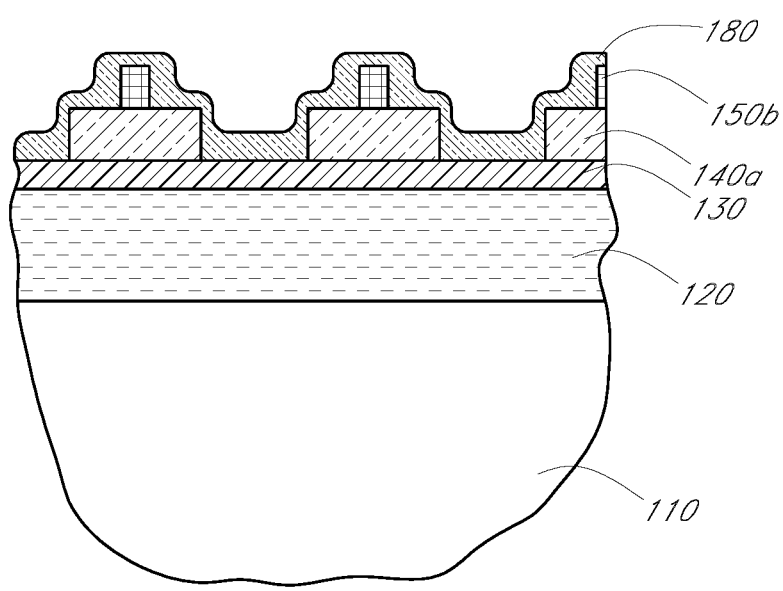
Figure 8:
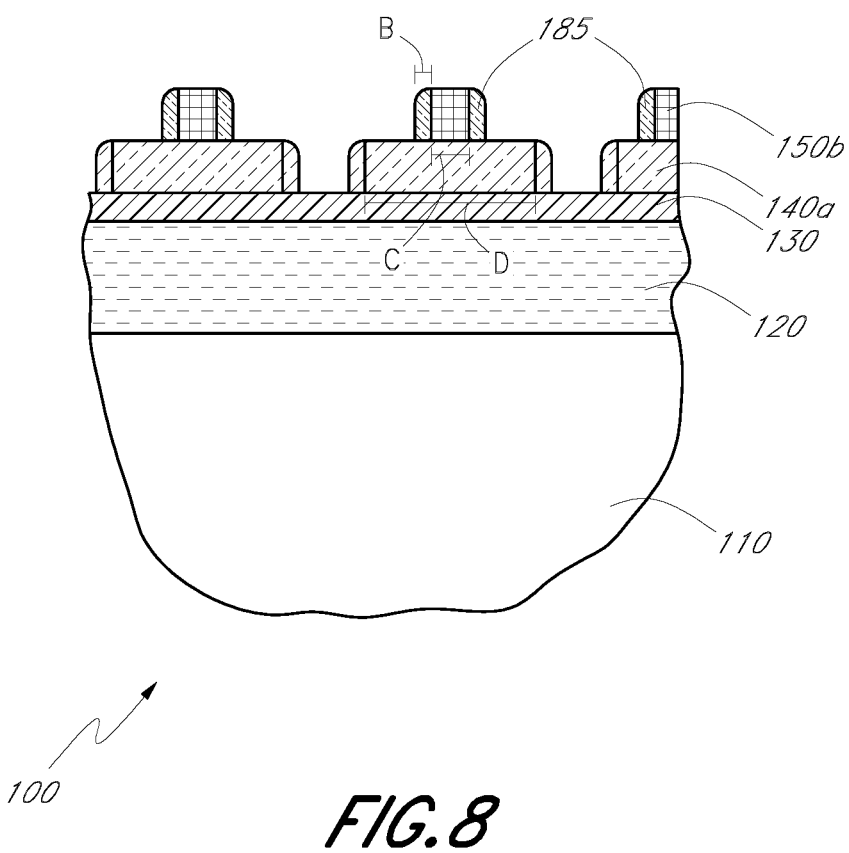

Next, with reference to FIGS. 7 and 8, spacers are simultaneously formed on sidewalls of mandrels 140a and 150b.

With reference to FIG. 7, a layer 180 of spacer material is conformally blanket deposited conformally over exposed surfaces, including the hard mask layer 130, and the tops and sidewalls of the first and second mandrels 140a and 150b. Layer 180 may have a thickness that approximately equals the desired width of spacers to be formed from the layer 180, taking into account any changes in dimensions that may occur due to subsequent processing steps, such as a spacer etch or mandrel removal. The layer 180 may be, e.g., formed of an oxide ($SiO_2$, $Al_2O_3$, $HfO_2$) or silicon oxynitride. The spacer layer 180 may be selectively etchable relative to the hard mask layer 130 and the first and second mandrels 140a and 150a.

Next, with reference to FIG. 8, the spacer layer 180 is subjected to an anisotropic (or directional) etch to preferentially remove spacer material from horizontal surfaces of the partially-formed integrated circuit 100. Such a directional etch, also known as a spacer etch, can be performed using, e.g., a reactive ion etch (RIE) employing a $CF_4$, $CHF_3$ and/or $CH_2F_2$-containing plasma in the case of $SiO_2$ spacer material. The etching chemistry may be selective to the material comprising the spacer layer 180.

With continued reference to FIG. 8, the widths of the spacers 185 are denoted by "B", the widths of the first mandrels 140a are denoted by "C" and the widths of the second mandrels 150b are denoted by "D." In one embodiment, "B" may be less than or equal to (C−D)/2. In another embodiment, "B" may be less than or equal to (C−D)/3. In still another embodiment, "B" may be approximately equal to (C−D)/4. In some embodiments, "B" is selected in order to have approximately equal line/space patterns. In one embodiment, "B" is approximately equal to "D." The spacer width "B" is determined by the processing conditions (e.g., deposited thickness, etching chemistry, exposure time) used to form the spacers 185.

Figure 11:
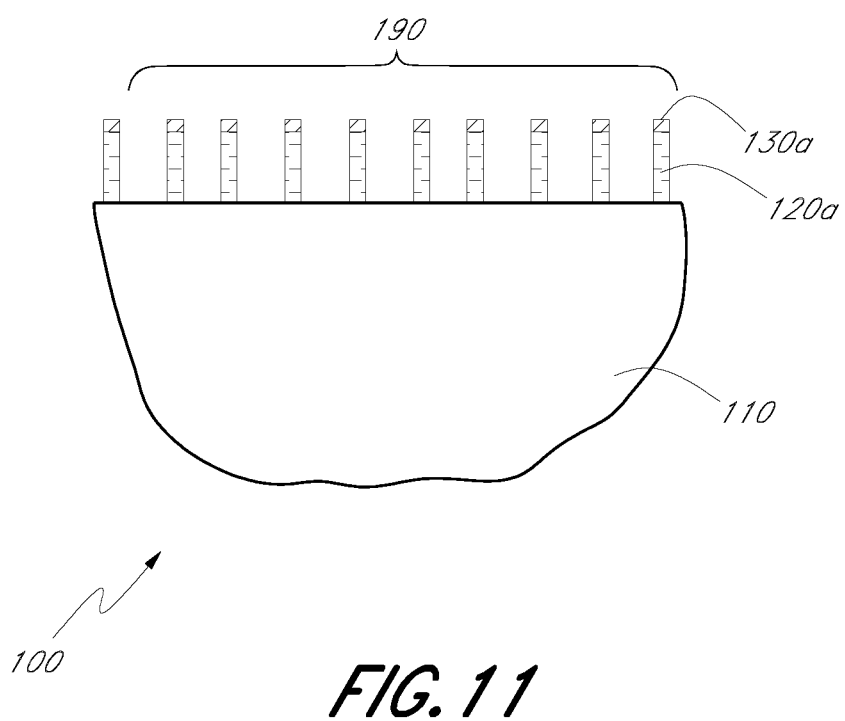
Figure 12A:
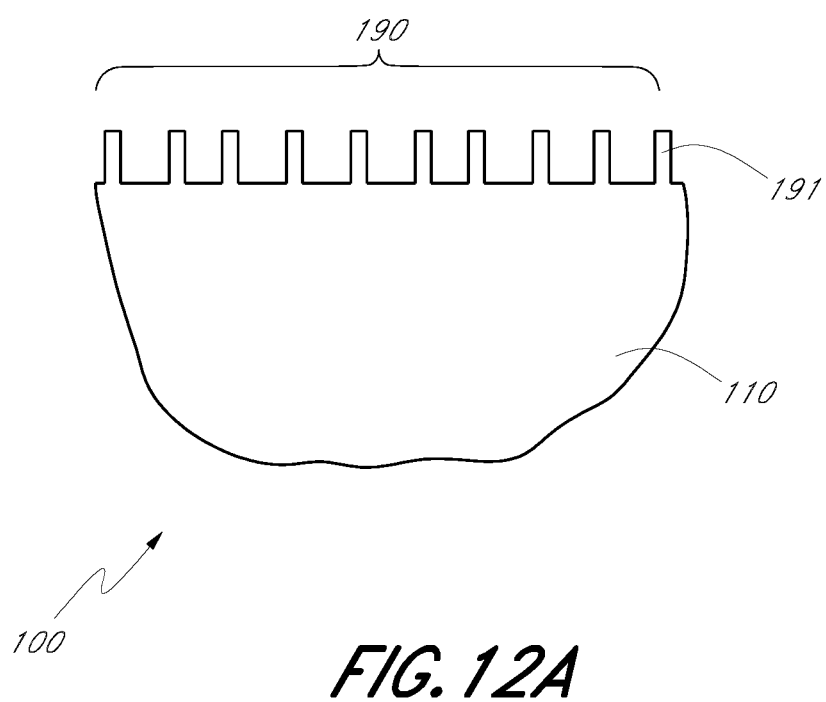
FIGS. 12A and 12B are schematic, cross-sectional side and top plan views of the partially-formed integrated circuit of FIG. 11, after the pattern of lines is transferred to the substrate and the hard mask and transfer layers are removed, in accordance with an embodiment of the invention.
Figure 12B:
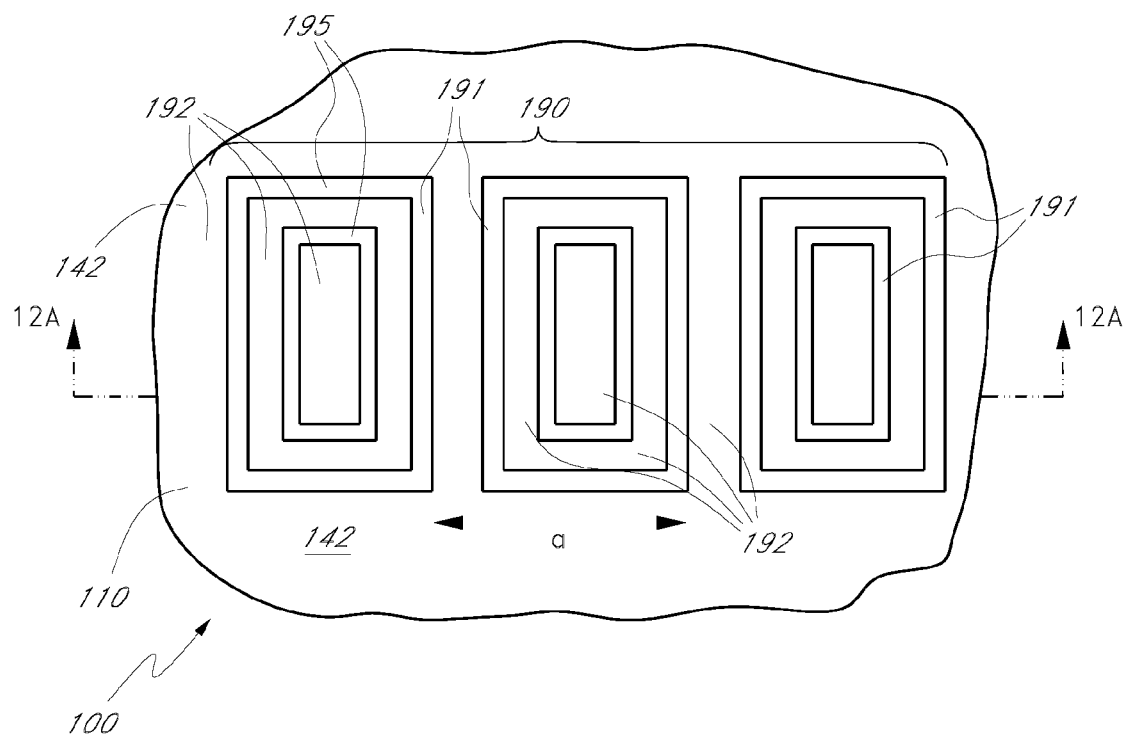
Figure 12C:
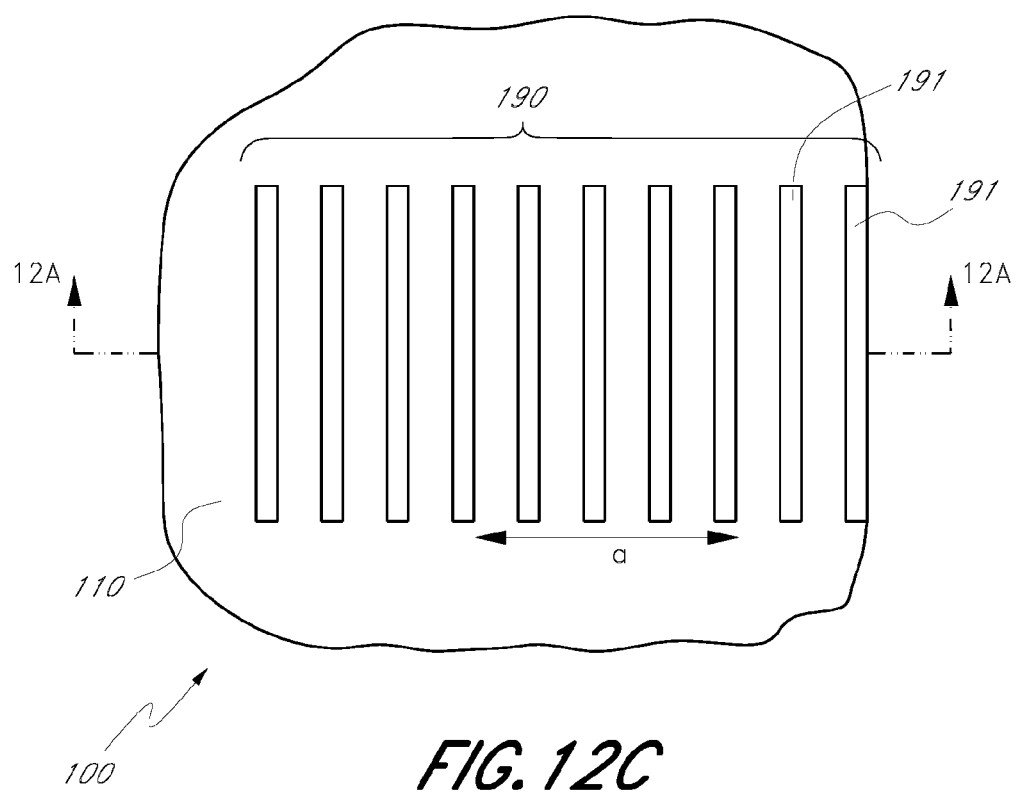
FIG. 12C is a schematic, top plan view of the partially-formed integrated circuit of FIGS. 12A and 12B, after terminal ends or "loops" of the lines have been removed, in accordance with an embodiment of the invention.

It will be appreciated that the locations and widths of the features shown in FIG. 8 will control the locations and widths of the mask features ultimately formed (see FIGS. 10 and 11) and the ultimate pattern in the substrate 110 (see FIGS. 12A and 12B).

Figure 9:
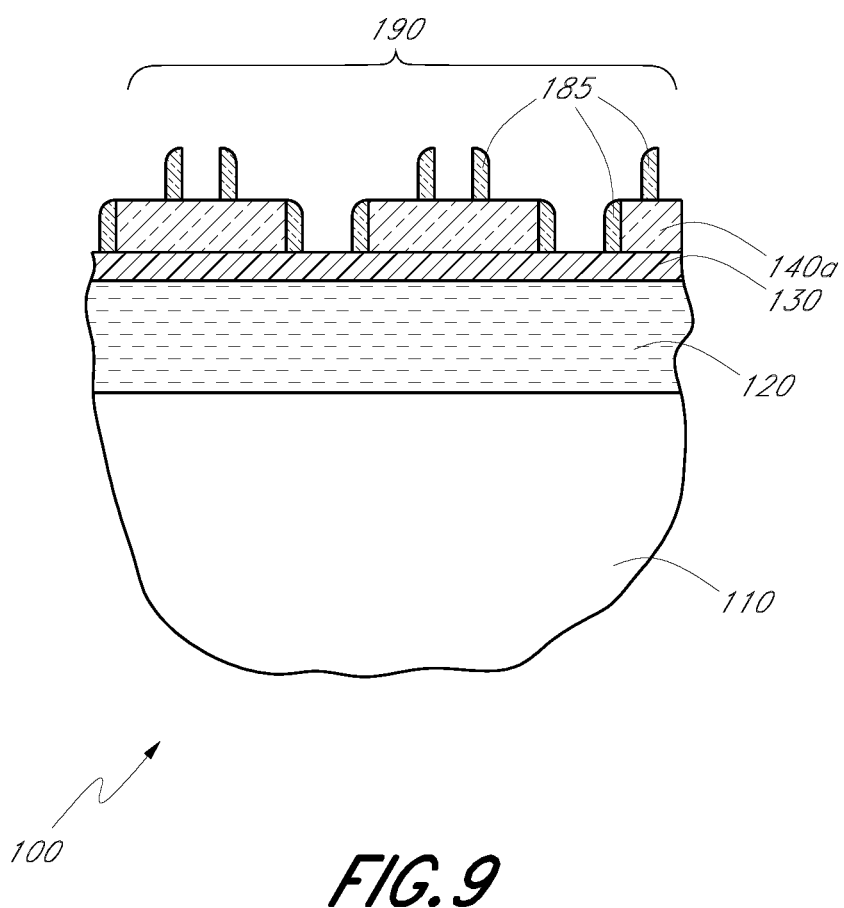
Figure 10:
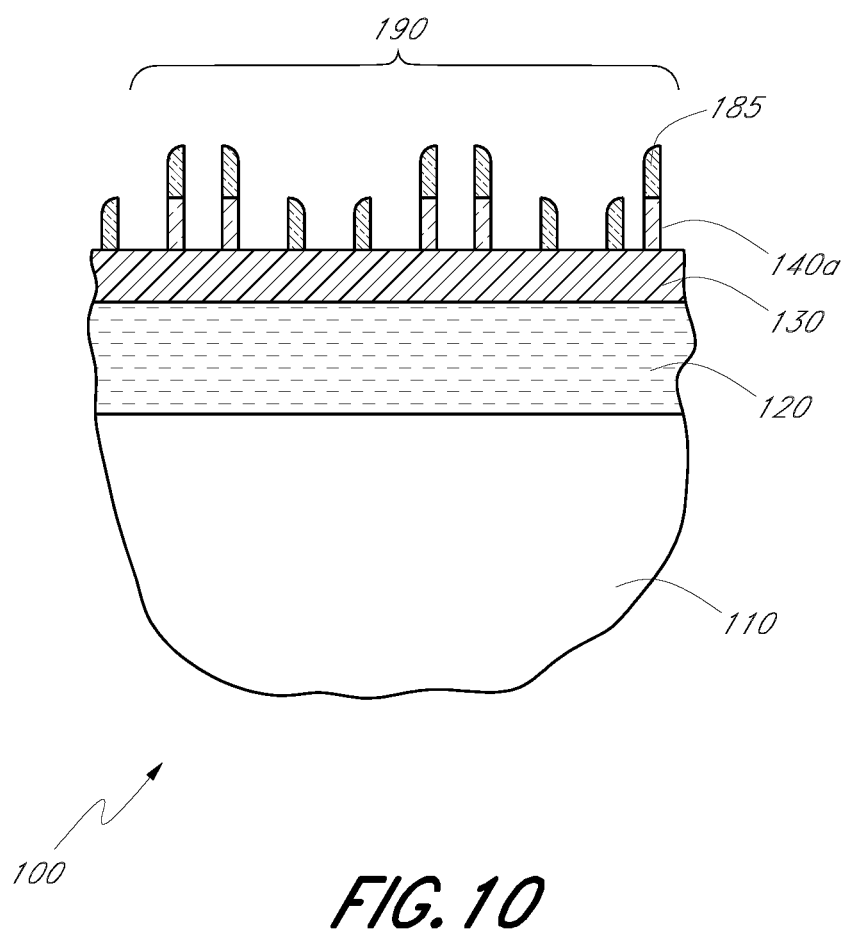

Next, with reference to FIGS. 9 and 10, exposed portions of the first and second mandrels 140a and 150b (i.e., portions of mandrels 140a and 150b not covered by spacers 185) are selectively removed to leave freestanding spacers. The freestanding spacers define a pattern of spacers 190. The figures show a cross-section of the pattern 190 of lines that extend into and out of the page. In one embodiment, mandrel removal is performed using a single anisotropic etching chemistry that selectively removes the first and second mandrels 140a and 150b. In the illustrated embodiment, mandrel removal is performed using a first etching chemistry to remove exposed portions of the second mandrel 150b, followed by a second etching chemistry to remove exposed portions of the first mandrel 140a. As an example, if the first mandrels 140a are formed of amorphous silicon and the second mandrels 150b are formed of a photoresist material, mandrels 150b may be etched using an oxygen-containing plasma and mandrels 140a maybe etched using an HBr plasma. Silicon oxide spacers 185 would resist both etches, as would the material (e.g., $Si_3N_4$) comprising hard mask layer 130.

Next, with reference to FIG. 11, the pattern 190 of spacers is transferred to layers 120 and 130, thus forming lines 120a and 130a. Pattern transfer can be accomplished sequentially (i.e., transfer to layer 130 followed by transfer to layer 120) using a selective mask etching chemistry for each layer, or simultaneously using the same etching chemistry. As an example, if layer 130 is formed of $Si_3N_4$, the etching chemistry may comprise a fluorine-containing plasma, such as, e.g., a $CHF_3/O_2$/He plasma or a $C_4F_8$/CO/Ar plasma. As another example, if layer 130 is formed of $Al_2O_3$ or $HfO_2$, a $BCl_3$-containing plasma may be used. The transfer layer 120 may be subsequently etched using a directional etch that may be selective for the material of layer 120. As an example, if layer 120 is formed of amorphous carbon, a sulfur- and oxygen-containing plasma, such as, e.g., an $SO_2/O_2$ plasma, can be used.

As illustrated in the sequence from FIGS. 10 to 11, the spacers 185 and remaining portions of the first mandrels 140a can be removed to reduce the aspect ratio of mask features before processing through the mask etching the substrate 110. For example, where the spacers 185 comprise a silicon oxide (e.g., $SiO_2$) and the first mandrels 140a comprise amorphous silicon, spacer removal can be performed using a wet or dry etch. Depending upon the selected removal chemistry, spacer/mandrel removal can be performed after etching of the hard mask layer 130 but before etching the transfer layer 120. The mandrels can be selectively removed relative to the hard mask and transfer layers 120, 130.

Next, with reference to FIGS. 12A and 12B, with lines 120a and 130a serving as a mask, the pattern 190 is transferred to the substrate 110 to form a pattern 190 of lines 191 alternated with spaces or trenches 192 in the substrate 110. FIG. 12B is a schematic, top-plan view of the integrated circuit 100 following pattern transfer. FIG. 12A is a cross-section taken along line 12A-12A of FIG. 12B. While in the illustrated embodiment lines 120a and 130a serve as a mask for pattern transfer to the substrate 110, it will be appreciated that lines 130a may be removed and that lines 120a may serve as the mask. The pattern 190 can be transferred to the substrate using an etching chemistry based on the material of the substrate. As an example, if the substrate comprises silicon, an anisotropic etch, e.g., a $BCl_3/Cl_2$ or fluorocarbon plasma etch, may be used to selectively etch the substrate 110 through the pattern formed in the transfer layer 120. If the substrate comprises $SiO_2$ (ILD) over a silicon wafer, a fluorocarbon plasma etching chemistry may be used to form damascene features. If the substrate comprises a metal, such as, e.g., Al, a chlorine-based plasma may be used to form conductive lines. Lines 120a and 130a may be subsequently selectively removed. As an alternative, lines 120a and 130a may be removed using chemical mechanical polishing (CMP) that stops at the top surface of the substrate 110.

With continued reference to FIG. 12B, the lines 191 are conjoined by loop end lines 195 at the ends of the array. Loop end lines 195 are the product of spacer deposition at terminal ends of the mandrel lines. Note that during the shrink or trim process on the upper mandrels, the upper mandrels shrink in both x and y directions (as well as vertically), producing the illustrated concentric spacer loops. Of course, when defining lines for a memory array, the lines are much longer compared to their widths than the dimensions shown. If individual lines are desired, a separate mask and etch step (not shown) is performed to remove the terminal loop ends of either the spacer patterns (FIG. 10 or 11) or the resultant lines 191 in the substrate 110. For example, a mask may be applied to protect lines 191 (leaving the terminal ends and lines 195 uncovered) and an etching chemistry is used to remove lines 195. The protective mask is subsequently removed to give the pattern 190 of lines 191 illustrated in FIG. 12C. Alternatively, for a damascene process, a protective mask can block the ends of the spacer patterns (FIG. 10 or 11) prior to transfer into lower layers (FIG. 11 or 12A and 12B).

Consequently, a pattern 190 of lines 191 (e.g., conductive lines) pitch-multiplied by a factor of four is formed in the substrate 110 using a single spacer formation step. Where the integrated circuit 100 includes one mandrel per spacing "a" prior to pitch multiplication (see FIG. 5), following pitch, the spacing "a" comprises four lines.

It will be appreciated that the pattern 190 of lines 191 may have at the periphery various integrated circuit components, such as landing pads and non-pitch multiplied features (e.g., lines). In subsequent processing steps, interconnects may be formed to the lines 191.

In one embodiment, the lines 191 may be spaced between about 50 and 100 nanometers (nm) from one another. In another embodiment, the lines 191 may be spaced between about 20 and 50 nm from one another. In some embodiments, the spacing between the lines may be selected to avoid electrical shorting between the lines.

While the process illustrated in FIGS. 3-12 has been used to form lines, it will be appreciated that the process can be used to form damascene features. In such a case, the substrate 110 can be an insulator (e.g., $SiO_2$) and spaces 192, which are pitch-multiplied by a factor of four, represent the locations of trenches to be formed in the insulator, which can be filled with a conductive material.

Pitch Multiplication by a Factor of Six

Embodiments of methods for forming a pattern of features (e.g., lines, spaces) pitch-multiplied by a factor of six will be discussed.

Figure 13A:
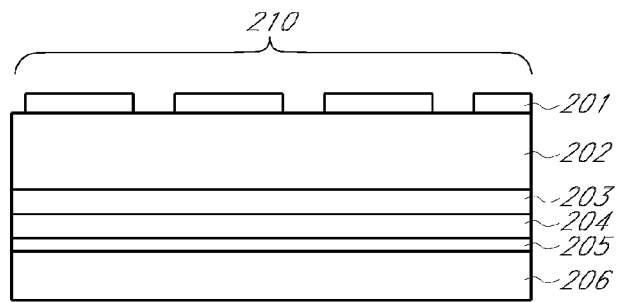
FIGS. 13A-13H are schematic, cross-sectional side views of a process for forming a pattern of features pitch-multiplied by a factor of six, in accordance with an embodiment of the invention.

With reference to FIG. 13A, in an embodiment, a pattern of features 210 is formed in a photodefinable layer 201 disposed over a plurality of masking layers, which include, from top to bottom, a first hard mask layer 202, a second hard mask layer 203, a third hard mask layer 204, a fourth hard mask layer 205 and a substrate 206. As in the previous embodiments, the substrate can include a top semiconductor layer or portion of a wafer to be patterned or doped, a conductive layer to be patterned or an insulator to be patterned to form, e.g., damascene features. In the illustrated embodiment, the features are lines oriented perpendicularly with respect to the plane of the page. While the illustrated embodiment comprises first, second, third and fourth hard mask layers 202-205, it will be appreciated that other hard mask and temporary layers may be provided, such as additional intervening etch-stop layers.

It will be appreciated that methods of embodiments of the invention may be used to pattern a conductive layer (e.g., Si, polysilicon, Al, W, $WSi_x$, Ti, TiN, etc.) over a semiconductor wafer to form conductive lines, a semiconductor wafer, or an insulator (e.g., $SiO_2$) over a semiconductor wafer to form damascene features.

Figure 13B:
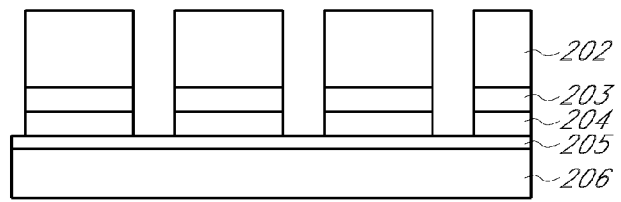
Figure 13C:
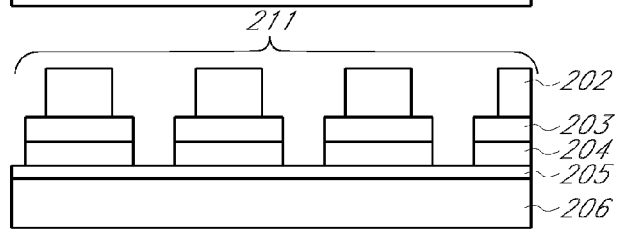
Figure 13D:
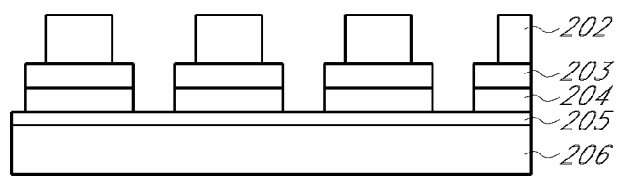

With reference to FIG. 13B, the pattern of features 210 is transferred to the first, second and third hard mask layers 202-204 using a single etch or a series of selective etches. Next, with reference to FIG. 13C, the first hard mask layer 202 is isotropically trimmed. The etching chemistry selectively trims the material comprising the first hard mask layer 202. The isotropic etch forms an altered pattern of features 211 in the first hard mask layer 202. Next, with the first hard mask layer 202 serving as a mask, the altered pattern of features 211 is transferred to the second hard mask layer 203 using an anisotropic (or directional) etching chemistry selective to the material comprising the third hard mask layer 203, as illustrated in FIG. 13D. Next, with reference to FIG. 13E, the first hard mask layer 202 is isotropically and selectively etched (relative to the second and third hard mask layers 203 and 204).

Figure 13E:
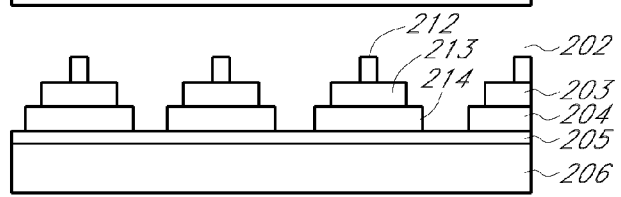

While FIGS. 13B-13E are described with respect to a particular etch sequence, the skilled artisan will appreciate other etch sequences that can arrive at the structure of FIG. 13E.

Figure 13F:
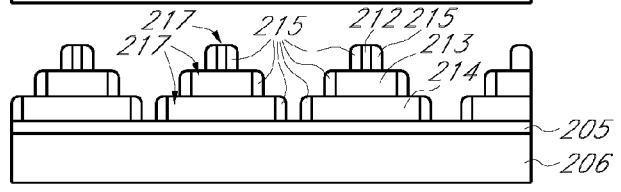
Figure 13G:
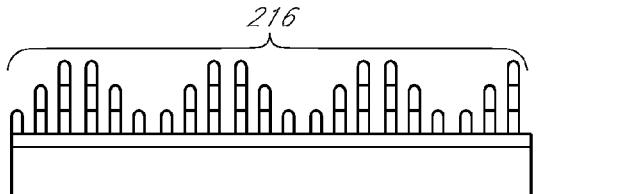

The lines at this stage of the pitch multiplication process define first, second and third mandrels 212-214 in the first, second and third hard mask layers 202-204, respectively. In one embodiment, the second and third mandrels extend parallel to the first mandrel, at least for the majority of their length. Next, spacer material is conformally deposited on the mandrels 212-214 and anisotropically etched to form spacers 215 around the mandrels 212-214, as shown in FIG. 13F. Next, with the mandrels 212-214 serving as a mask, exposed portions 217 of the mandrels 212-214 are anisotropically etched to form a pattern 216 of lines pitched multiplied by a factor of six relative to the lines formed in the photodefinable layer 201 (see FIG. 13A), as shown in FIG. 13G. In other words, in the space where photolithography had defined one line and one space (FIG. 13A), six lines and six spaces are now defined (FIG. 13G).

Figure 13H:
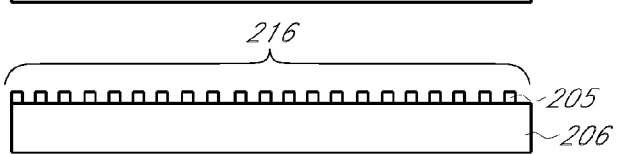

Next, with reference to FIG. 13H, the pattern of lines 216 is transferred to the fourth hard mask layer 205 using an etching chemistry selective for the material comprising the fourth hard mask layer 205. The fourth hard mask layer (or transfer layer) 205 will serve as a mask for subsequent pattern transfer to the substrate 206 (not shown) or other processing of the substrate through the mask (e.g., oxidation, nitridation, electrical doping, self-aligned silicidation, etc.).

FIGS. 14-21 illustrate a process for forming features pitch-multiplied by a factor of six, in accordance with another embodiment of the invention, wherein a photoresist doubles as the topmost mandrel.

Figure 14:
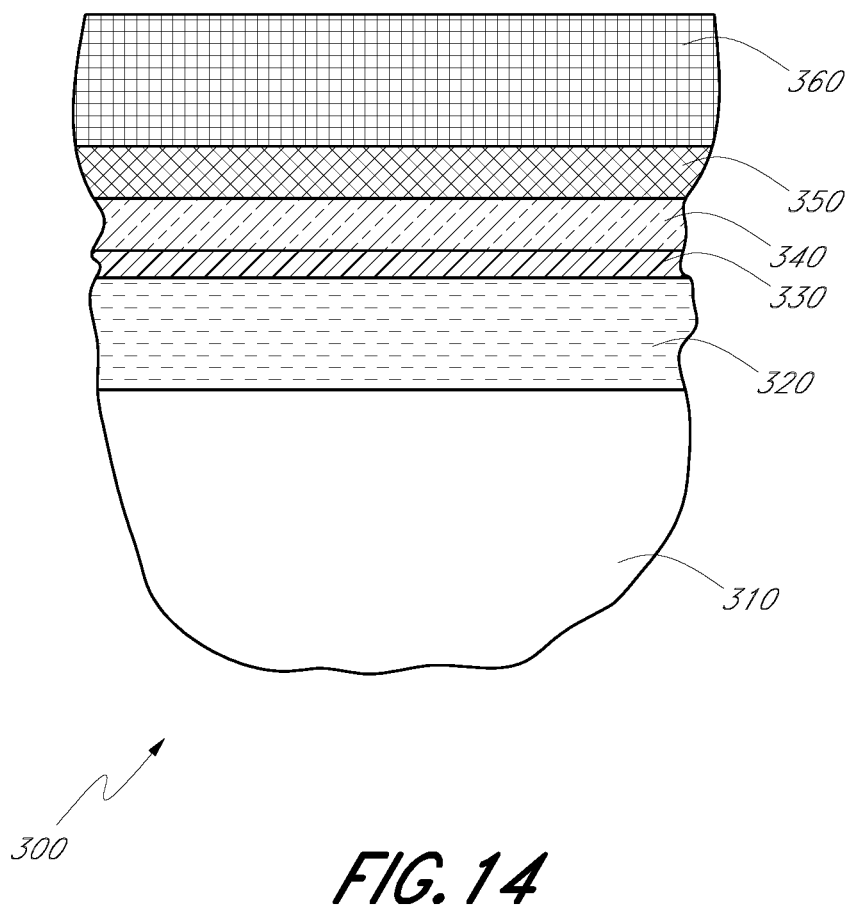

With reference to FIG. 14, a partially-formed integrated circuit 300 comprises, from bottom to top, a substrate 310, a transfer layer 320, a first hard mask layer 330, a second hard mask layer 340, a third hard mask layer 350 and a layer of a photodefinable material 360. The transfer layer 320 will serve as the final mask for pattern transfer to the substrate 310. In subsequently processing steps, mandrels will be formed in layers 340-360, with the mandrels in layer 360 being formed of a photodefinable material. However, as in FIGS. 13A-13H, layer 360 may be a hard mask layer and the integrated circuit 300 further comprises a photodefinable layer overlying layer 360.

With continued reference to FIG. 14, the substrate 310 can include a top semiconductor layer or portion of a wafer to be patterned or doped, a conductive layer to be patterned or an insulator to be patterned to form, e.g., damascene features. The photoresist layer 360 may be formed of any photoresist material, including any photoresist material known in the art, and may be compatible with 157 nm, 193 nm, 248 nm or 365 nm wavelength optical scanners, 193 nm wavelength immersion systems, extreme ultraviolet systems (including 13.7 nm systems), or electron beam lithographic systems.

The materials for the layers 320-360 overlying the substrate 310 may be chosen based upon consideration of the chemistry and process conditions for the various pattern-forming and pattern-transferring steps discussed herein. Each of the layers 320-360 may be chosen so that it can be selectively etched relative to other exposed materials of the steps discussed below. Because a goal of the layers 320-360 overlying the substrate 310 is to allow well-defined patterns to be formed in the substrate 310, it will be appreciated that one or more of the layers 320-360 can be substituted if suitable materials, chemistries and/or process conditions are used. Additionally, it will be appreciated that additional masking layers can be added over the substrate 310 to form a mask having improved etch selectivity relative to the substrate 310, such as additional intervening etch-stop layers. As an example, with layer 360 formed of a photodefinable material, layer 350 may be formed of BARC, a spin-on organic film or amorphous carbon; layer 340 may be formed of amorphous silicon; layer 330 may be formed of $Si_3N_4$; and layer 320 may be formed of amorphous carbon. The skilled artisan will appreciate that other combinations and permutations of materials for each of the layers 320-360 are possible.

Figure 15A:
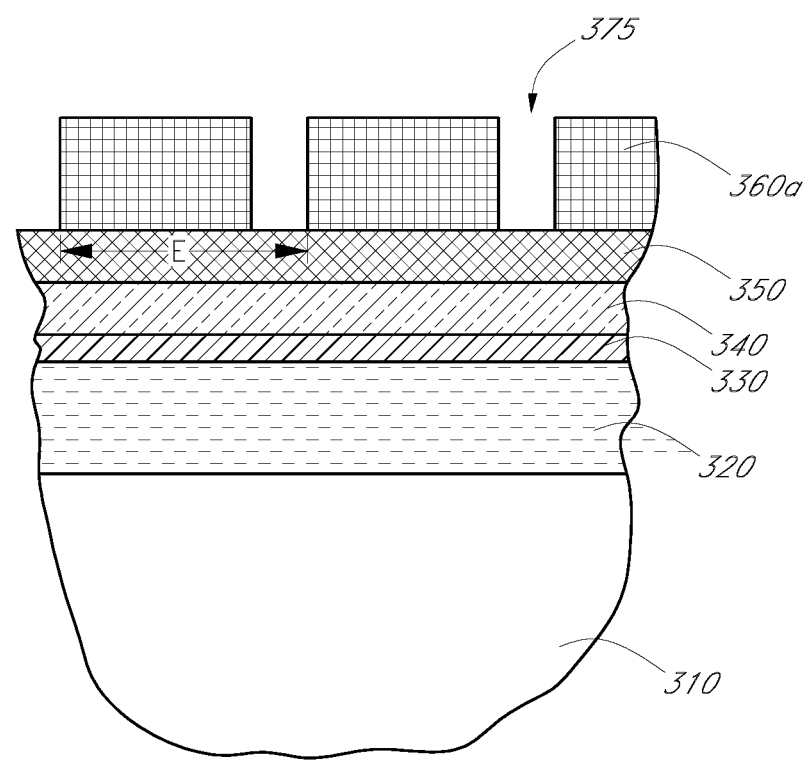
FIGS. 15A and 15B are schematic, cross-sectional side and top plan views of the partially-formed integrated circuit of FIG. 14, after a pattern of lines is formed in the photodefinable layer, in accordance with an embodiment of the invention.
Figure 15B:
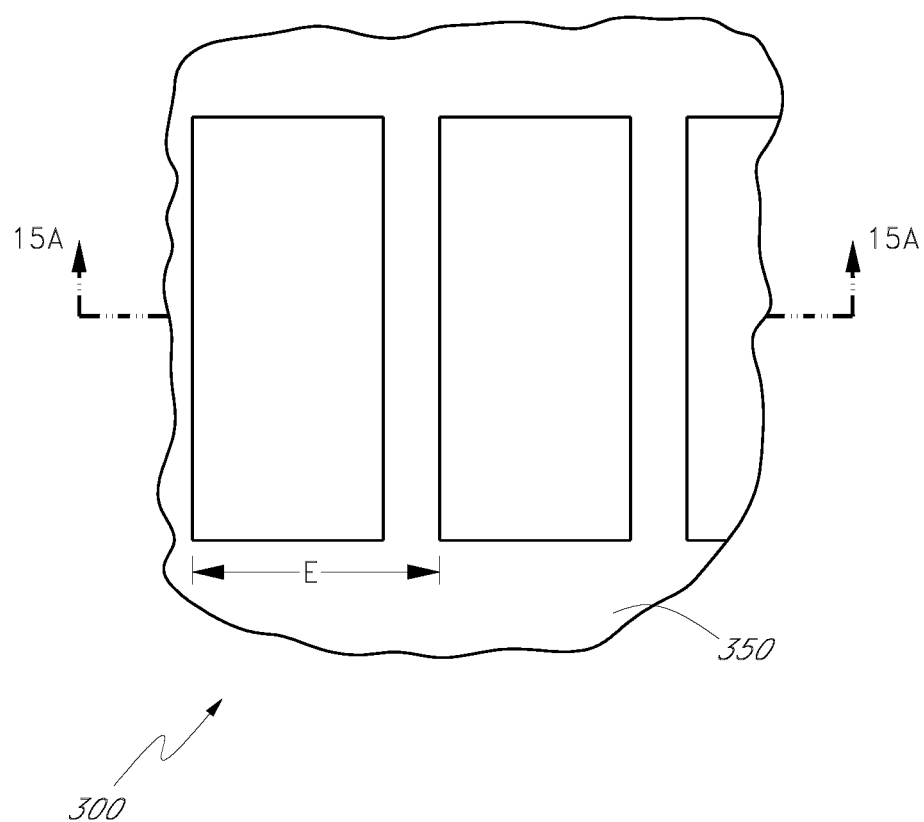

With reference to FIGS. 15A and 15B, a pattern 370 comprising spaces or trenches 375, which are delimited by features 360a formed of photodefinable material, is formed in the photodefinable layer 360. FIG. 15B is a schematic, top-plan view of the in-process integrated circuit 300 following formation of the pattern 370 in the photodefinable layer 360. FIG. 15A is a cross-section taken along line 15A-15A of FIG. 15B. The trenches 375 may be formed by, e.g., photolithography using 248 nm or 193 nm light, in which the photodefinable layer 360 is exposed to radiation through a reticle and then developed. Layer 360 may be formed of a material that has a higher etch rate than layer 350 with respect to particular chemistries used (see below). In general, a lower resolution photolithography system (e.g., 248 nm) system can be used for the illustrated processes, while still achieving much finer feature sizes. In one embodiment, layer 360 is formed of a 248 nm resist. In the illustrated embodiment, the pitch is designated by "E."

The features 360a may comprise parallel and elongated lines, as shown, with their parallel lengths at least 10 times their widths, more typically at least 100 times their widths. While parallel for the majority of their lengths, it will be understood from the description of FIGS. 23A-23C (described below) that the lines can include bends or turns particularly to facilitate contacts. The features are most useful for forming regular arrays of lines, e.g., for use in memory devices.

Figure 16:
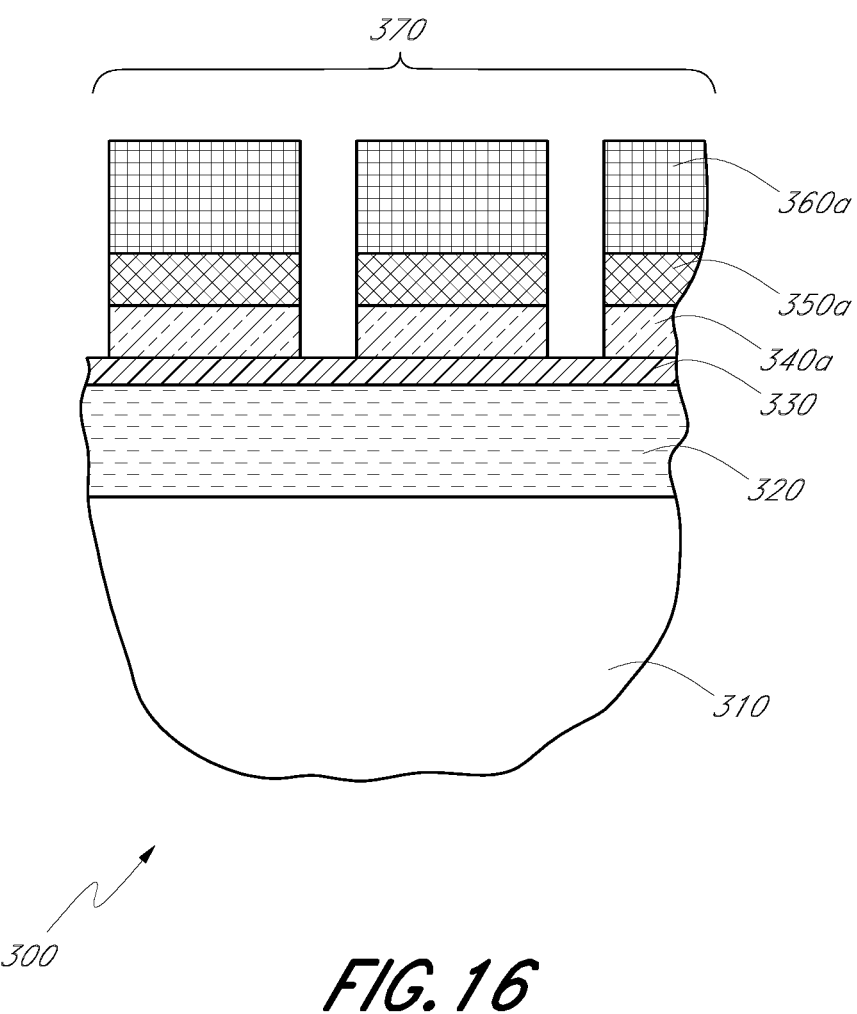

With reference to FIG. 16, the pattern 370 of lines 360a in the photodefinable layer 360 is transferred to the second and third hard mask layers 340 and 350, creating lines 340a and 350a. This transfer may be accomplished using an anisotropic (or directional) etch selective to the material of layers 340 and 350. In one embodiment, the pattern transfer comprises using a first etching chemistry selective to the material of layer 350 followed by an etching chemistry selective to the material of layer 340. In another embodiment, a single etching chemistry may be used to etch layers 340 and 350. As an example, the pattern transfer may be accomplished using $SO_2/O_2/Ar/N_2$ plasma to etch layer 350, followed by an HBr plasma to etch layer 340. In the illustrated embodiment, the etching chemistry does not significantly remove the material comprising layer 330, which in the illustrated embodiment acts as an etch stop. As an alternative, pattern transfer may be accomplished using a sputter etch (e.g., Ar sputter etch) through layers 340 and 350, in which case sputtering would be timed so as to not etch layer 330.

Figure 17:
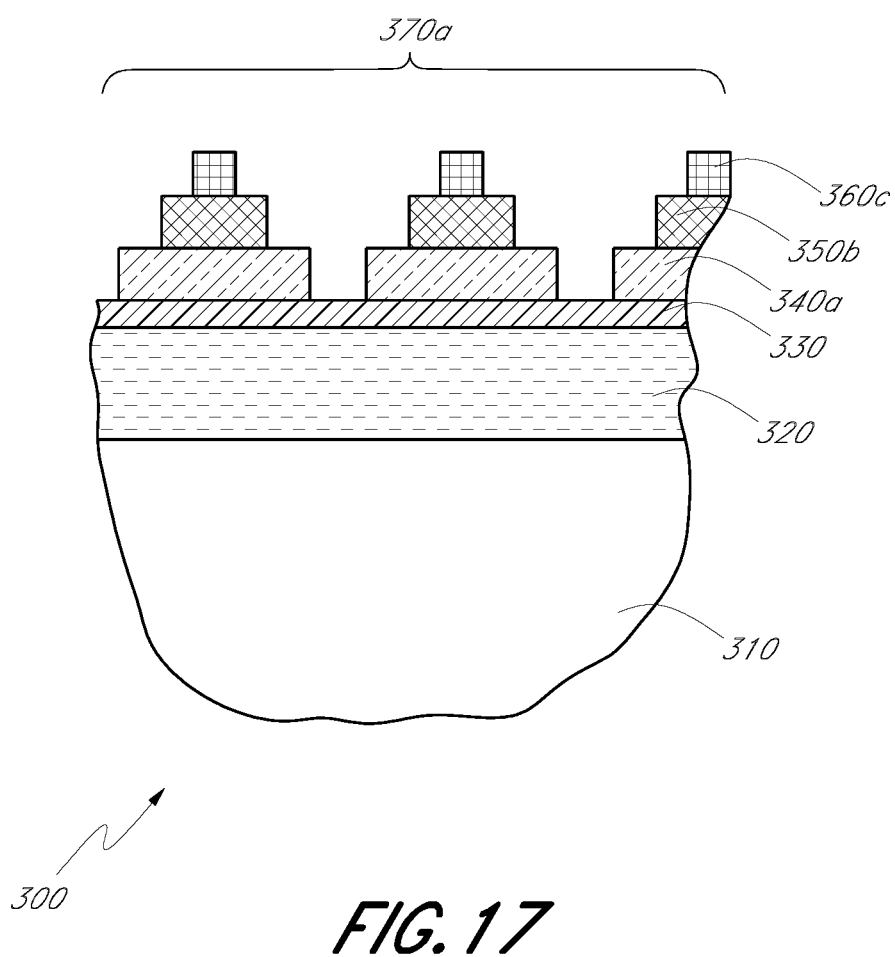

With reference to FIG. 17, lines 360a and 350a are trimmed by isotropically and selectively etching relative to lines 340a and layer 330 to form lines 360c and 350b. By choosing the right combination of materials for layers 360a and 350a (see FIG. 16) and an appropriate trim chemistry, a transition from FIG. 16 to FIG. 17 can be achieved in one trim step, as illustrated. If layers 350a and 350b are organic, $O_2/Cl_2$, $O_2/HBr$ or $O_2/SO_2/N_2$ plasmas could be used. Alternatively, the different mandrel materials at different levels can be isotropically and selectively trimmed to different degrees in multiple trim steps at to arrive at the structure of FIG. 17.

Figure 18:
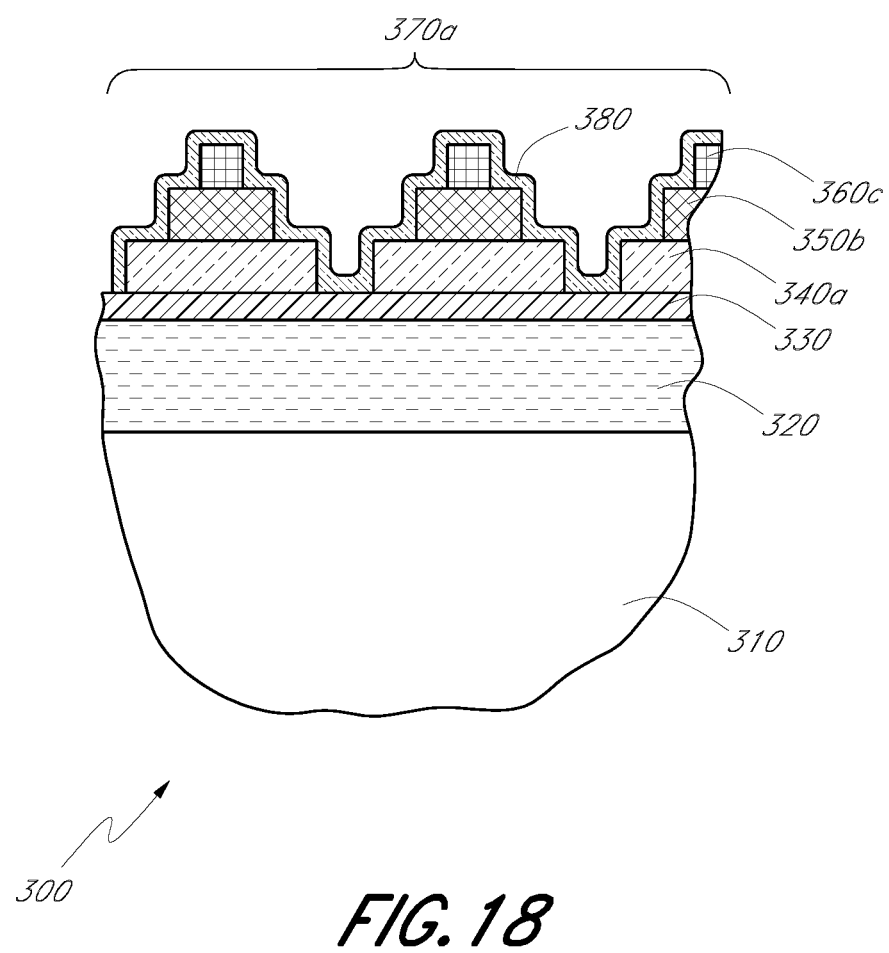
Figure 19:
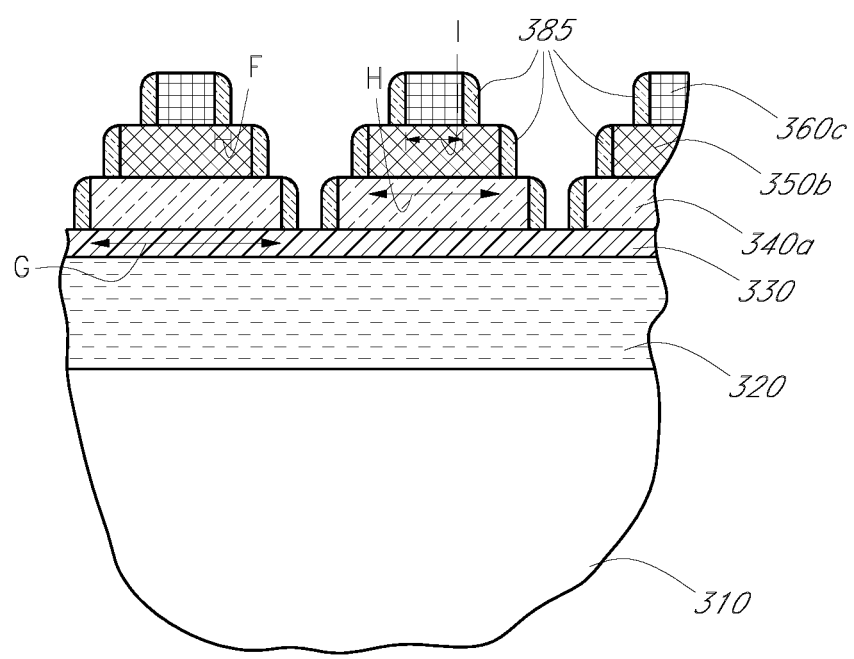

Next, with reference to FIGS. 18 and 19, spacers are simultaneously formed on sidewalls of mandrels 340a and 350b and 360c.

With reference to FIG. 18, a layer 380 of spacer material is conformally blanket deposited conformally over exposed surfaces of the integrated circuit 300, including layer 330 and tops and sidewalls of the mandrels 340a, 350b and 360c. Layer 380 may have a thickness that approximately equals the desired width of spacers 385 to be formed (FIG. 19), taking into account any changes in dimensions that may occur due to subsequent processing steps, such as a spacer etch or mandrel removal. The layer 380 may be formed, e.g., of an oxide (e.g., $SiO_2$, $Al_2O_3$, $HfO_2$) or silicon oxynitride, for the material combination noted above. More generally, the spacer layer 380 may be selectively etchable relative to the hard mask layer 330 and the mandrels 340a, 350b and 360c.

With reference to FIG. 19, the spacer layer 380 is subjected to an anisotropic (or directional) etch to remove spacer material from horizontal surfaces of the partially formed integrated circuit 300. The etching chemistry may be selective to the material of the spacer layer 380. Such a directional etch, also known as a spacer etch, can be performed using, e.g., RIE employing a $CF_4$, $CHF_3$ and/or $NF_3$-containing plasma for the material combination selected.

With continued reference to FIG. 19, the widths of the spacers 385 are denoted by "F", the widths of the first mandrels 340a are denoted by "G", the widths of the second mandrels 350b are denoted by "H" and the widths of the third mandrels 360c are denoted by "I". The spacer width "F" will determine the spacing between features formed in the substrate 310. In one embodiment, "F" may be less than or equal to (H–I)/2. In another embodiment, "F" may be less than or equal to (H–I)/3. In still another embodiment, "F" may be approximately equal to (H–I)/4. "F" may be selected so as to obtain even line/space widths. In one embodiment, the difference between "G" and "H" (i.e., G–H) is approximately equal to the difference between "H" and "I" (i.e., H–I). "I" may be approximately equal to "F." The spacer width "F" is determined by the processing conditions (e.g., deposited thickness, etching chemistry, etching time) used to form the spacers 385.

Figure 21:
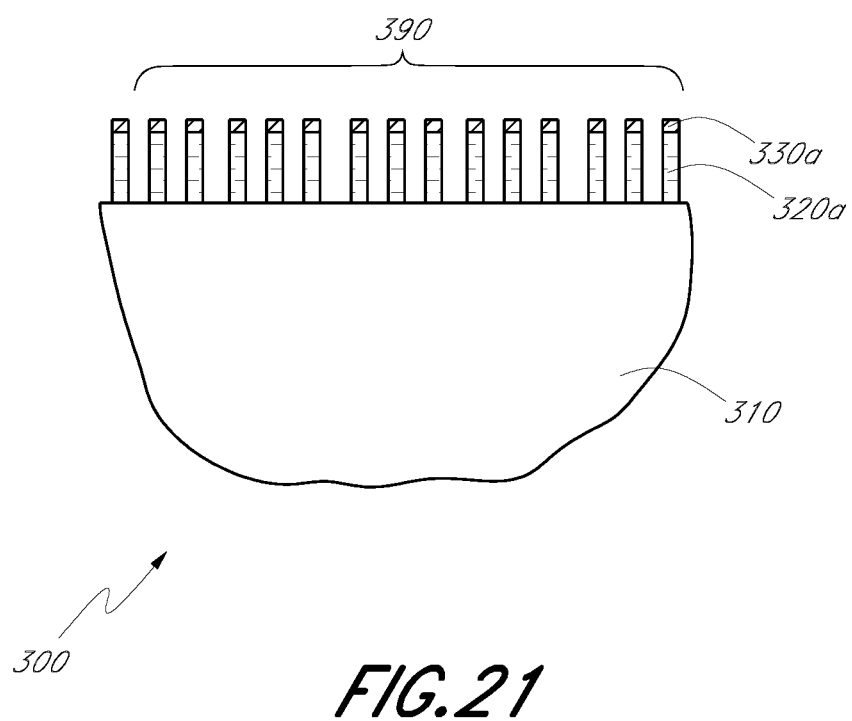
Figure 22A:
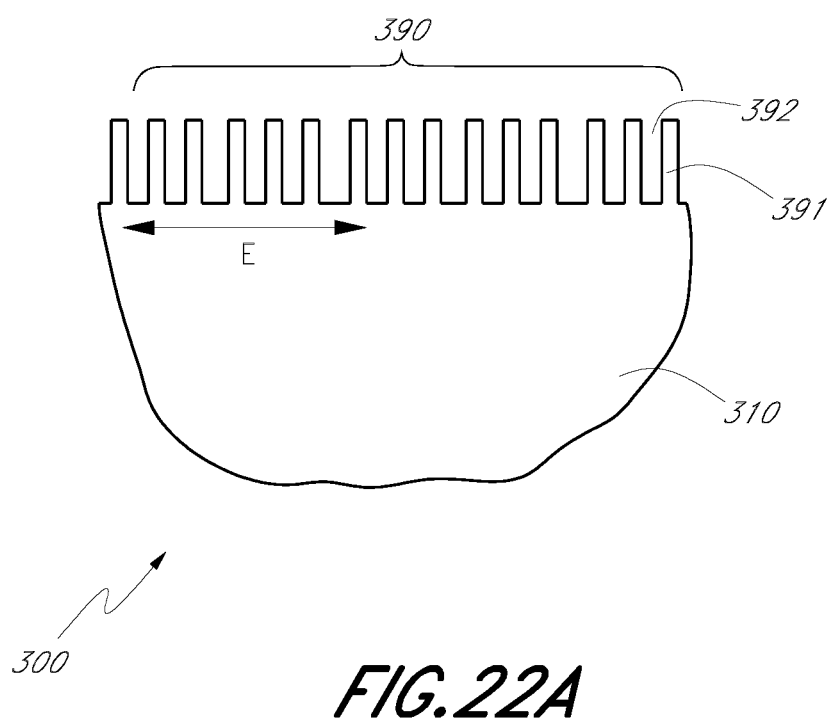
Figure 22B:
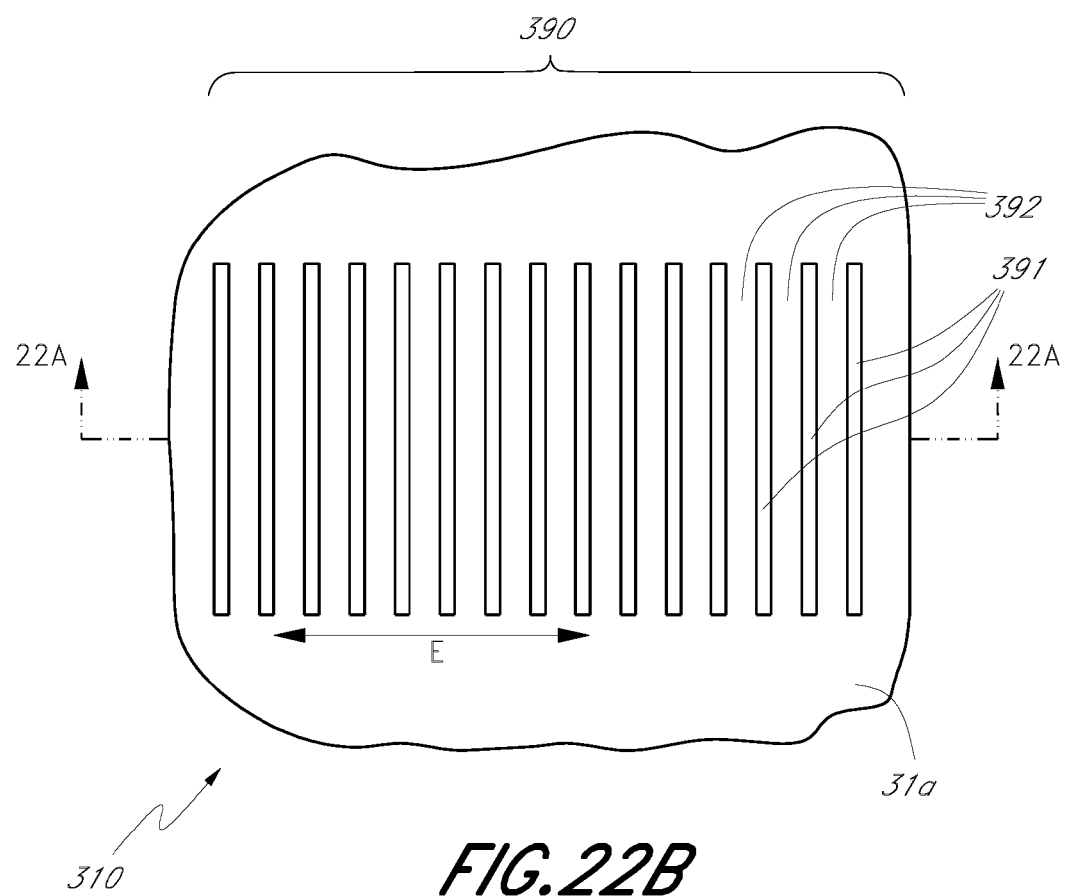

It will be appreciated that the locations and widths of the features shown in FIG. 19 will control the locations and widths of the mask features ultimately formed (see FIGS. 20 and 21) and the ultimate pattern in the substrate 310 (see FIGS. 22A and 22B).

Figure 20:
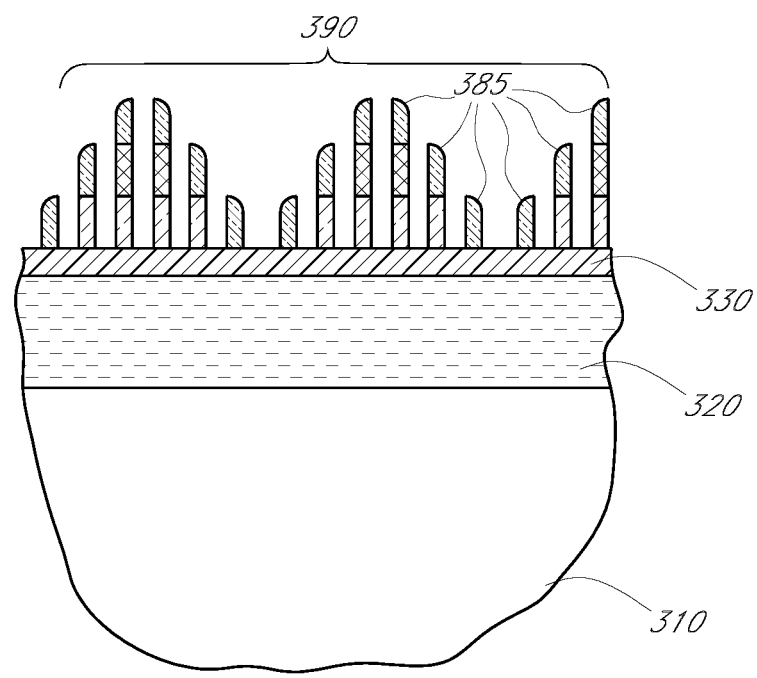

Next, with reference to FIGS. 19-21, exposed portions of the mandrels 340a, 350b and 360c (i.e., portions of mandrels 340a, 350b and 360c not covered by spacers 385) are selectively removed to leave freestanding spacers 385. The freestanding spacers 385 define a pattern 390 of spacers, which may define a pattern of elongated lines to be formed in the substrate 310. The illustrated embodiment is a cross-section of the pattern 390 of lines extending into and out of the page. The mandrels may be etched using, e.g., an etching chemistry selective to at least one of the layers 340-360, or a plurality of selective etching chemistries. As an example, the pattern transfer may be accomplished using an $SO_2/O_2/Ar/N_2$ RIE to etch mandrels 350b and 360c, followed by an HBr RIE plasma to etch mandrels 340a.

Next, with reference to FIG. 21, the pattern 390 of spacers is transferred to layers 320 and 330, thus forming lines 320a and 330a. Pattern transfer can be accomplished sequentially (i.e., layer 330 followed by layer 320) using an etching chemistry selective to each layer, or simultaneously using the same etching chemistry or a physical (sputter etch). As an example, if layer 330 is formed of $Si_3N_4$, a fluorine-containing plasma, such as, e.g., $CHF_3/O_2/He$ or $C_4F_8/CO/Ar$ plasma, can be used. As another example, if layer 330 is formed of $Al_2O_3$ or $HfO_2$, a $BCl_3$-containing plasma may be used. The transfer layer 320 may be subsequently etched using a directional etch that may be selective to the material comprising layer 320. As an example, if layer 320 is formed of BARC or amorphous carbon, a sulfur-containing plasma, such as, e.g., an $SO_2/O$ plasma, can be used.

As illustrated in the sequence from FIGS. 20 to 21, the spacers 385 and remaining portions of the first and second mandrels 340a and 350b may be removed to reduce the aspect ratio of mask features prior to processing (e.g., etching the substrate) through the mask. For example, where the spacers 385 comprise a silicon oxide (e.g., $SiO_2$), the first mandrels 340a comprise amorphous silicon and the second mandrels 350b comprise amorphous carbon, spacer removal can be performed using a wet or dry etch, such as, e.g., a wet buffered oxide etch or a dry etch using a fluorine-based plasma. As an alternative, the spacers 385 and mandrels 340a and 350b may be removed using spin-on filler and chemical mechanical polishing (CMP). The hard mask layer 330 may serve as an etch stop barrier to protect the pattern 390 within the transfer layer 320. Depending upon the selected removal chemistry, spacer/mandrel removal can be performed after etching of the hard mask layer 330 but before etching the transfer layer 320. The mandrels can be selectively removed relative to the hard mask layer 330 and transfer layer 320.

Next, with reference to FIGS. 22A and 22B, with lines 320a and 330a serving as a mask, the pattern 390 is transferred to the substrate 310 to form a pattern 390 of lines 391 alternated with spaces or trenches 392 in the substrate 310. FIG. 22B is a schematic, top-plan view of the integrated circuit 300 following pattern transfer and a separate mask and etch step to remove terminal ends of the lines 391 (see below). FIG. 22A is a cross-section taken along line 22A-22A of FIG. 22B. While in the illustrated embodiment lines 320a and 330a serve as a mask for pattern transfer to the substrate 310, it will be appreciated that lines 330a may be removed and that lines 320a may serve as the mask.

With continued reference to FIGS. 22A and 22B, pattern transfer can be accomplished using an anisotropic etch, e.g., a $BCl_3/Cl_2$ plasma etch if the substrate to be etch is a semiconductor wafer or a conductor, to selectively etch the substrate 310 through the pattern formed in the transfer layer 320. Lines 320a and 330a may be subsequently selectively removed. As an alternative, lines 320a and 330a may be removed using chemical mechanical polishing (CMP).

A subsequent mask and etch step is performed to remove terminal ends of the lines 391. That is, a mask is applied to protect lines 391 (leaving the terminal ends uncovered) and an etching chemistry is used to remove the terminal ends. The protective mask is subsequently removed to give the pattern 390 of lines 391 illustrated in FIG. 22B. Alternatively, for a damascene process, a protective mask can block the ends of the spacer loops (see FIG. 12B and attendant discussion) prior to transfer to lower layers.

Thus, a pattern of lines pitch-multiplied by a factor of six relative to the pattern formed in the photodefinable layer 360 (see FIG. 15A). Where the integrated circuit 300 includes one mandrel and one space or trench per spacing "E" prior to pitch multiplication (see FIG. 15A), following pitch multiplication the spacing "E" comprises six lines 391 and six spaces or trenches 392.

In one embodiment, the lines 390 may be spaced between about 50 and 100 nanometers (nm) from one another. In another embodiment, the lines 390 may be spaced between about 20 and 50 nm from one another. In some embodiments, the spacing between the lines may be selected to avoid electrical shorting between the lines.

Figure 23A:
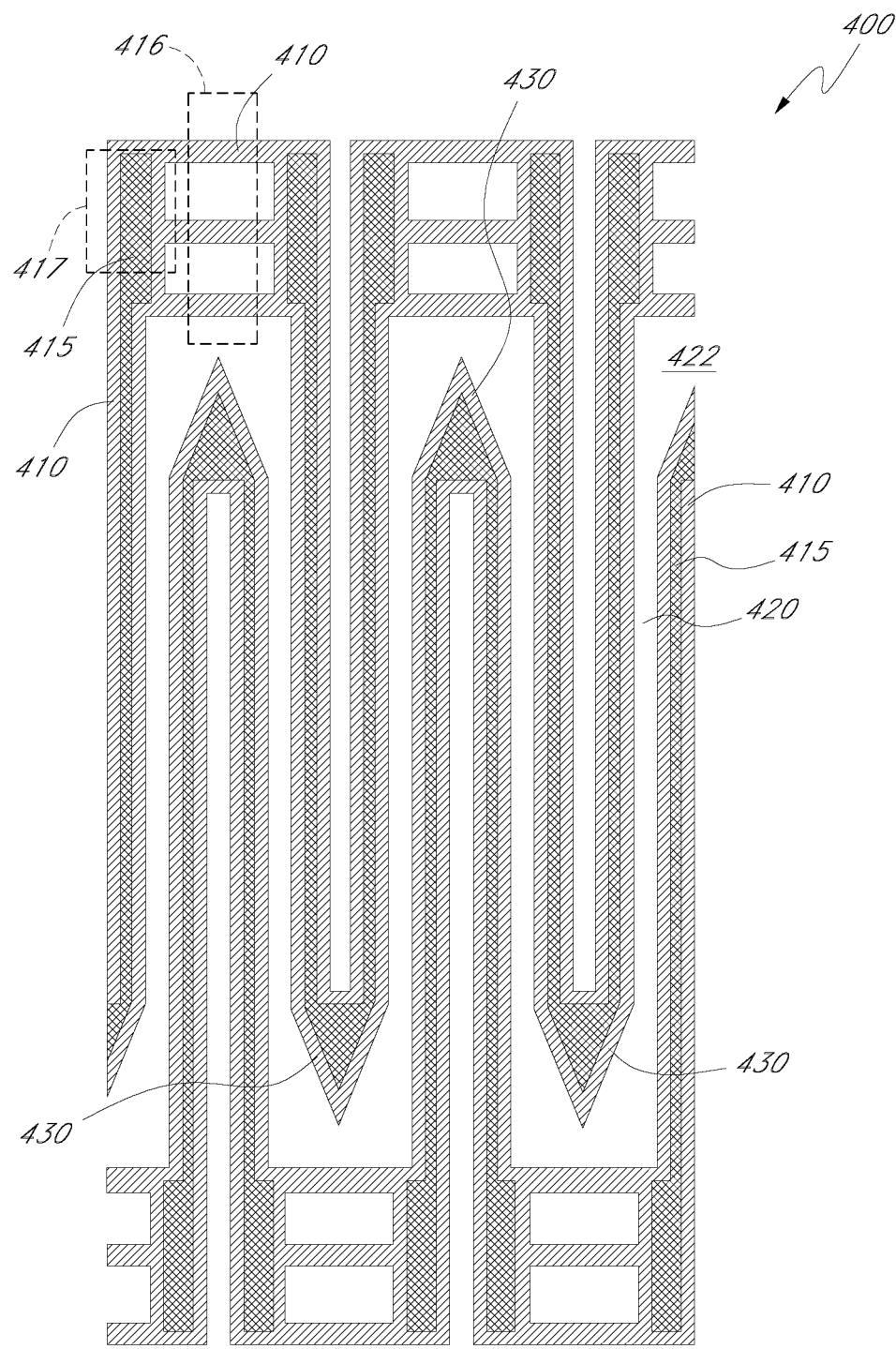
FIGS. 23A-23C are schematic, top plan views of a partially formed integrated circuit, showing a method by which contacts are provided to lines formed according to the methods of FIGS. 2-22B, in accordance with an embodiment of the invention.
Figure 23B:
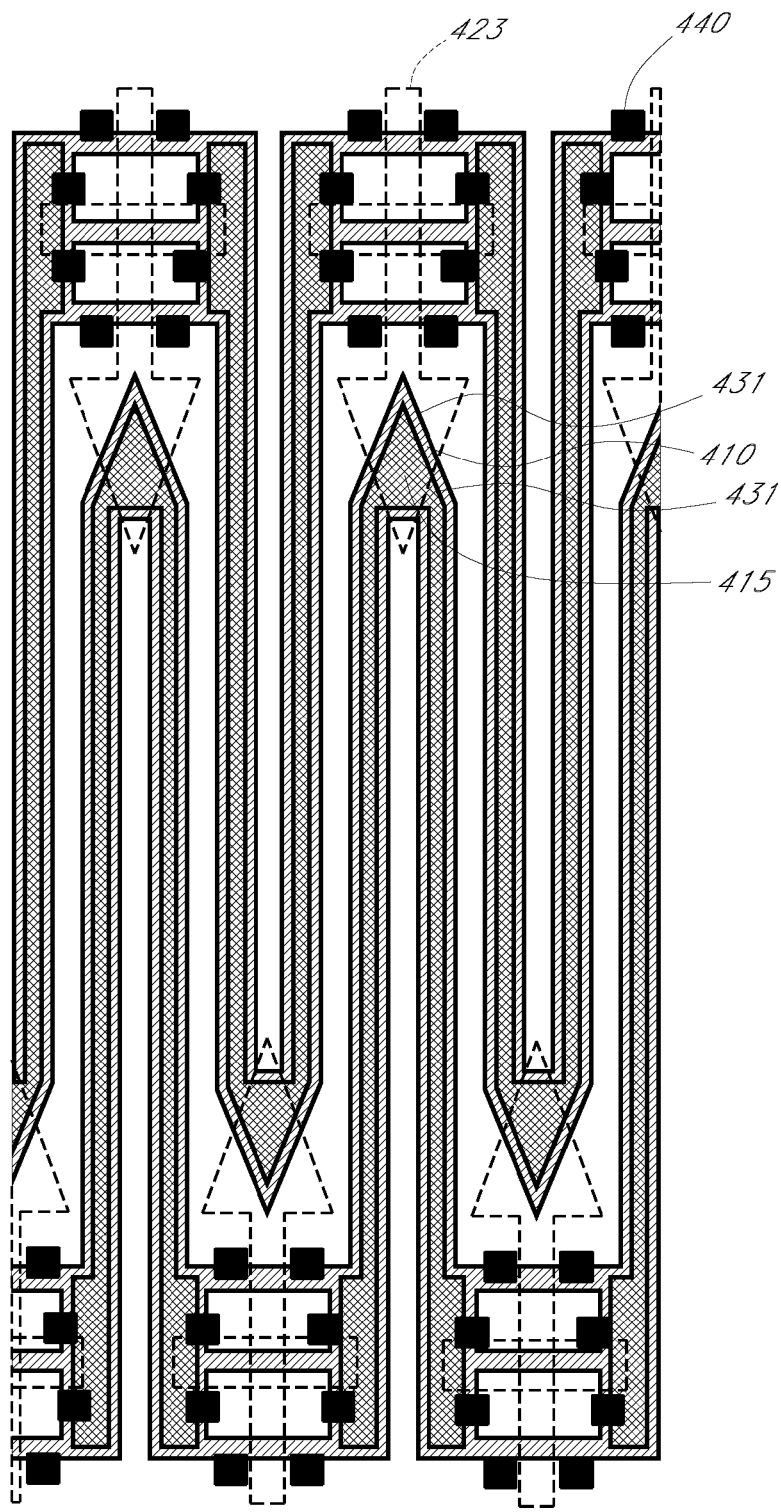
Figure 23C:
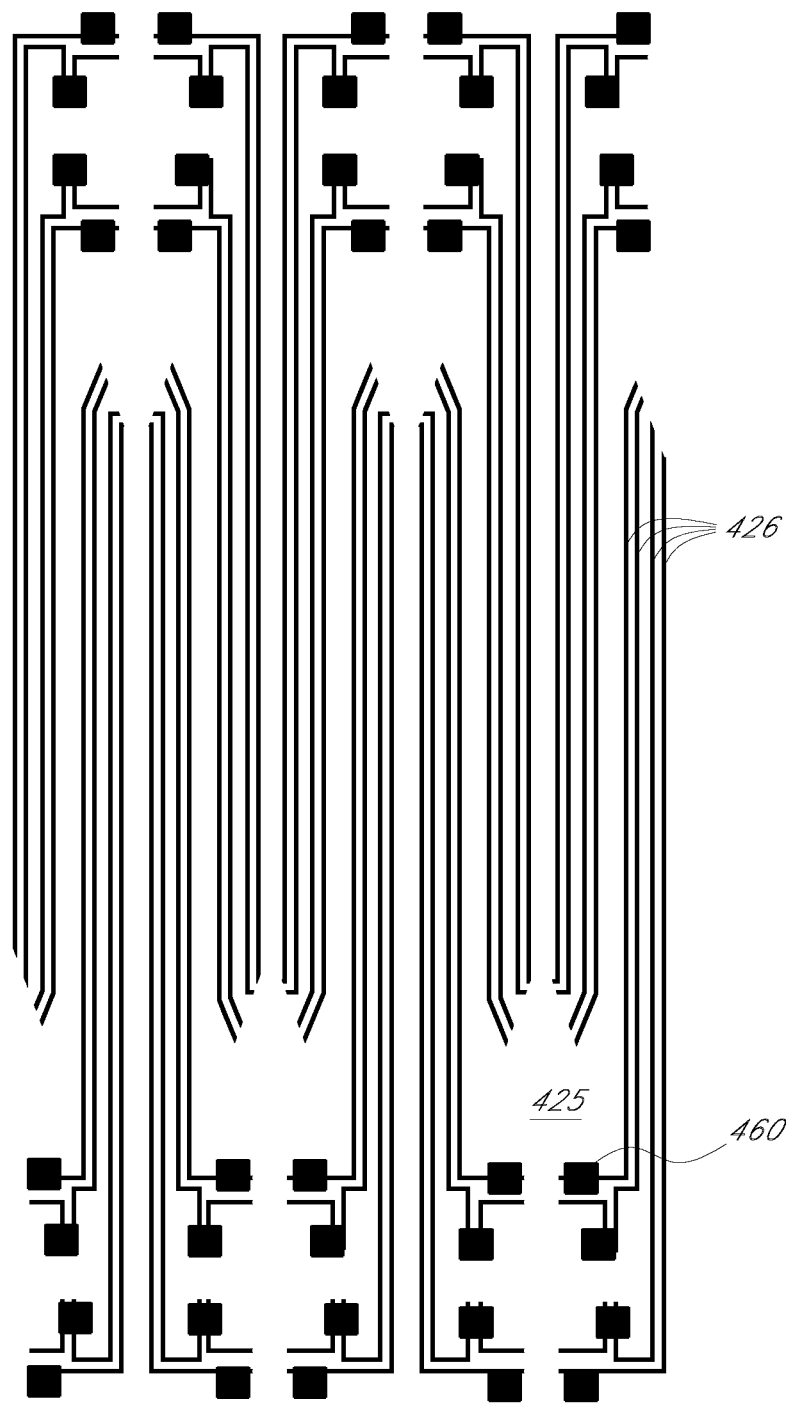

With reference to FIGS. 23A-23C, a sequence of steps for forming contacts to lines formed using embodiments of methods is illustrated. The illustrated sequence is an example of contact formation for lines pitch multiplied by a factor of four; however, the skilled artisan will appreciate that the principles taught hereby may also be used to form contacts to lines pitch-multiplied by a factor of six, eight, etc.

FIG. 23A is a schematic, top-plan view of a partially formed integrated circuit 400 after forming mandrels 410 and 415. The mandrels define elongate and pitch-multiplied lines. The pitch-multiplied lines adjoin non-pitch multiplied features (e.g., conductive lines, contacts or pads). The integrated circuit 400 may be analogous to that shown in FIGS. 6A and 6B. Mandrels 415 overlie mandrels 410, which are delimited by spaces 420. The mandrels overlie a hard mask layer 422 (seen through the spaces 420), a transfer layer (not shown) and a substrate 425 (see FIG. 23C). The substrate comprises a conductive layer (e.g., Si, polysilicon, Al, W, $WSi_x$, Ti, TiN, etc.) overlying a semiconductor wafer 425 (see FIG. 23C).

The integrated circuit 400 comprises loops or bends 430 at the terminal ends of the mandrels 410 and 415.

It will be understood from the above description that the vertically stacked mandrels 410, 415 as initially patterned (e.g., by photolithography) had the same width. However, after differential shrinking or trimming, the upper mandrel 415 is made more narrow than the lower mandrel 410. Accordingly, the initial pattern was chosen with narrower sections 416 such that the trim process completely removes the upper mandrel from those narrower sections 416, leaving sections of lower mandrel 410 without any overlying upper mandrel. Furthermore, the remaining lower mandrel 410 includes relatively wider windows of space between the lines of lower mandrel 410 in this narrower section 416. Two such adjacent windows are shown in each narrower section 416 in the illustration of FIG. 23A. As will be appreciated from the subsequent figures, both the features of the narrower bridges and wide windows in the section 416 facilitate electrical connection of pitch multiplied features to non-pitch-multiplied features such as contacts.

Furthermore, other sections 417 of the pattern are made wider than the lines. After trimming, the upper mandrel 415 remains wider than in the array section. As will be appreciated from the subsequent figures, the spacers formed in such wider sections 417 are spaced farther apart, also facilitating separate electrical connection of the pitch-multiplied lines using non-pitch-multiplied features such as contacts. Thus, as demonstrated by the three different widths in wide section 417, narrow section 416 and intermediate sections defining the lines in the array, the initial pattern includes varying widths of lines along the pattern to facilitate electrical connection among features to be defined by the sidewall spacers.

With reference to FIG. 23B, spacers 431 are formed by conformally blanket depositing spacer material over the mandrels 410 and 415 followed by a directional spacer etch (preferentially etching horizontal segments of the blanket conformal spacer layer) to form a spacer pattern. The spacers 431 are represented by thick black lines on the edges of the mandrels 410, 415 in FIG. 23B. The trim and spacer etches may be performed such that they do not etch the hard mask layer 422. Dotted arrows 423 designate locations at which conductive lines 426 (see FIG. 23C) will be cut (for conventional etching) or blocked (for damascene fabrication). Mask features 440 (which might be defined by a separate contact mask after conductive lines 426 of FIG. 23C are defined) serve as locations of bond pads 460 (see below) that will be formed following pattern transfer to the conductive layer overlying the substrate 425. The illustrated arrows shapes 423 cross the wider windows of space noted above, such that conventional photolithography can accurately place the blocking or cutting mask.

Next, with reference to FIG. 23C, the spacer pattern is transferred to the conductive layer overlying the substrate 425, and portions of the lines underlying the arrows shown in FIG. 23B are removed to form isolated conductive lines 426. The integrated circuit of FIG. 23C further comprises bond pads 460 for establishing electrical contact to the lines 426.

While the sequence illustrated in FIGS. 23A-23C has been used to conventionally etch conductive lines, it will be appreciated that the sequence may be used to etch trenches for damascene features or lines in an insulating (e.g., $SiO_2$) or semiconducting (e.g., silicon) substrate.

While pitch-multiplied features have been illustrated in some embodiments, it will be appreciated that non-pitch multiplied features (e.g., landing pads) may be formed alongside pitch-multiplied features. In some cases, non-pitch multiplied features may overlap pitch-multiplied features.

Thus, in one embodiment, a method for fabricating an integrated circuit is provided. The method comprises providing a first mandrel over a substrate, the first mandrel having a first width, and providing a second mandrel substantially over the first mandrel, the second mandrel having a second width smaller than the first width. Spacers are simultaneously formed on sidewalls of the first and second mandrels. At least portions of the mandrels are selectively removed relative to the spacers to form a spacer pattern defined by the spacers, and the spacer pattern is transferred to the substrate.

In another embodiment, a method for using tiered mandrels to form a pattern of lines pitch-multiplied by a factor of 2n along one dimension is provided. The method comprises providing n tiers of stacked mandrels over a substrate, where n≥2, each of the n tiers comprising a plurality of elongated mandrels substantially parallel to one another, wherein the distance between adjacent mandrels at tier n is greater than the distance between adjacent mandrels at tier n−1. Spacers are simultaneously formed on sidewalls of the mandrels.

In still another embodiment, a partially-formed integrated circuit ("IC") is provided. The partially-formed IC comprises a first mandrel over a substrate, the first mandrel having a first width (A), and a second mandrel over the first mandrel, the second mandrel having a second width (B), wherein A>B. The partially-formed IC further comprises spacers on sidewalls of the mandrels, the spacers having a spacer width (C), wherein $$C \le \frac{(A-B)}{2}.$$

In another embodiment, a masking process, includes defining a pattern over two or more stacked films. The pattern is transferred into the two or more stacked films. Dimensions of elements in at least an upper film are reduced relative to a lower film of the two or more stacked films to produce two or more stacked mandrels. Sidewall spacers are formed on sidewalls of the stacked mandrels.

It will be appreciated by those skilled in the art that various other omissions, additions and modifications may be made to the methods and structures described above without departing from the scope of the invention. For example, and without limitation, though described in the context of arrays of lines (such as in memory arrays), the pitch multiplication techniques taught herein will have application to a variety of contexts. For example, the techniques taught herein can be applied to optical elements (e.g., diffraction gratings), MEMS structures, edge emitters, etc. In some of these applications, electrical connections to the pitch multiplied features is not required, even further simplifying the application. The methods taught herein are useful for extending feature sizes below photodefinable sizes, but have application even where optical resolution is not limiting, in order to employ less expensive photolithography systems. Furthermore, it will be understood that the techniques described herein can be extended to greater numbers of mandrel levels, and can be combined with techniques employing multiple spacer deposition steps, and the processes can be repeated multiple times to achieve more complex patterns. All such modifications and changes are intended to fall within the scope of the invention, as defined by the appended claims.

We claim:

1. A method for semiconductor processing, comprising:
   forming self-aligned tiered elongated mandrel structures having n tiers over a substrate, where n≥2, wherein mandrels at tier n are disposed over mandrels at tier n−1, wherein a distance between immediately adjacent mandrels at tier n is greater than a distance between adjacent mandrels at tier n−1, wherein the mandrels at tier n have exposed top surfaces, wherein mandrels at each tier are formed of a different material than mandrels at immediately adjacent tiers, wherein forming self-aligned tiered elongated mandrel structures comprises:
      forming a pattern in a photoresist layer, the pattern comprising photoresist features having a photoresist feature width;
      etching the pattern into two or more layers of the different materials corresponding to the tiers of the mandrel structure, the etched layers comprising etched features underlying the photoresist features and having a width substantially equal to the photoresist feature width; and
      subsequently reducing dimensions of etched features of the layer at tier n to form the mandrels at tier n;
   providing a layer of spacer material on the tiered mandrel structures; and
   subjecting the spacer material to an etch to simultaneously define spacers on sidewalls of each of the tiers.

2. The method of claim 1, wherein providing the tiered elongated mandrel structures comprises providing tier n substantially centered across the width of tier n−1.

3. The process of claim 1, wherein reducing dimensions removes the upper film over some sections of the substrate, thereby leaving an entire width of the lower film exposed over those sections.

4. The process of claim 1, further comprising forming photolithographically defined features for forming bond pads, the photolithographically defined features in contact with some of the spacers.

5. The process of claim 1, wherein the pattern comprises lines of varying widths, the lines defining tiers of the tiered elongated mandrel structures.

6. The process of claim 1, wherein forming the pattern comprises forming a window section between adjacent segments of the lower film to increase separation of spacers formed on a mandrel tier defined by the lower film in the window section relative to a separation of spacers formed on the mandrel tier defined by the lower film in other sections of the pattern.

7. The process of claim 6, wherein the window section comprises adjacent windows permitting lateral separation of spacers sufficient to enable non-pitch multiplied contacts to features defined by the spacers.

8. The method of claim 1, further comprising selectively removing at least portions of the tiered elongated mandrel structures relative to the spacers to form a spacer pattern defined by the spacers.

9. The method of claim 8, further comprising transferring the spacer pattern to the substrate.

10. The method of claim 9, wherein transferring the spacer pattern to the substrate comprises etching the substrate to define trenches.

11. The method of claim 10, wherein etching the substrate to define trenches defines interconnect lines in a partially fabricated memory device.

12. The method of claim 1, further comprising providing one or more hard mask layers between the substrate and the mandrel structures.

13. A method for semiconductor processing, comprising:
   providing a self-aligned tiered mandrel structure over a substrate, the tiered mandrel structure having a first elongated mandrel tier underlying a second elongated mandrel tier, the first elongated mandrel tier having a first width, the second mandrel having a second width smaller than the first width, wherein an uppermost tier of the mandrel structure has exposed top surfaces, wherein the first elongated mandrel tier and the second elongated mandrel tier are formed of different materials, wherein providing the self-aligned tiered mandrel structure comprises:

providing a pattern in a masking layer;

transferring the pattern into first and second layers of the different materials corresponding to the first and second elongated mandrel tiers of the mandrel structure; and subsequently reducing dimensions of patterned features of the second layer to form the second mandrel in the second layer; and simultaneously defining spacers on sidewalls of both the first and the second mandrels.

14. The method of claim 13, further comprising:

selectively anisotropically etching the mandrels relative to the spacers to form a spacer pattern defined by the spacers; and transferring the spacer pattern to the substrate.

15. The method of claim 14, wherein the spacer pattern comprises elongated loops having connected ends, further comprising:

providing a mask over the loop ends;

transferring a pattern defined by the spacers to the substrate, wherein the mask blocks transfer of the loop ends to the substrate, wherein transferring the spacer pattern to the substrate defines unconnected lines derived from unblocked portions of the loops.

16. The method of claim 14, wherein the spacer pattern comprises elongated loops having connected ends, further comprising removing the loop ends before transferring the spacer pattern to the substrate.

17. The method of claim 13, wherein providing the tiered mandrel structure over the substrate comprises providing the tiered mandrel over a conductor.

18. The method of claim 13, further comprising a third mandrel tier overlying the second mandrel tier, wherein the third mandrel tier has a third width less than the second width.

19. The method of claim 13, wherein the masking layer is a photodefinable layer and wherein forming the pattern in the masking layer comprises performing photolithography.

* * * * *